(12) United States Patent
Sekiya

(10) Patent No.: US 11,227,706 B2
(45) Date of Patent: Jan. 18, 2022

(54) SUPERCONDUCTING WIRE AND COIL UNIT

(71) Applicant: UNIVERSITY OF YAMANASHI, Yamanashi (JP)

(72) Inventor: Naoto Sekiya, Yamanashi-ken (JP)

(73) Assignee: UNIVERSITY OF YAMANASHI, Yamanashi (JP)

( * ) Notice: Subject to any disclaimer, the term of this patent is extended or adjusted under 35 U.S.C. 154(b) by 511 days.

(21) Appl. No.: 16/033,473

(22) Filed: Jul. 12, 2018

(65) Prior Publication Data

US 2019/0027278 A1    Jan. 24, 2019

(30) Foreign Application Priority Data

Jul. 20, 2017 (JP) .............................. JP2017-140498

(51) Int. Cl.
| | | |
|---|---|---|
| *H01B 12/06* | (2006.01) | |
| *H01F 6/06* | (2006.01) | |
| *H01L 39/14* | (2006.01) | |

(52) U.S. Cl.
CPC .............. *H01B 12/06* (2013.01); *H01F 6/06* (2013.01); *H01L 39/143* (2013.01)

(58) Field of Classification Search
CPC .................................. H01B 12/06; H01F 6/06
See application file for complete search history.

(56) References Cited

U.S. PATENT DOCUMENTS

| | | | |
|---|---|---|---|
| 2008/0231277 A1 | 9/2008 | Yamamoto et al. | |
| 2010/0173784 A1* | 7/2010 | Lee ....................... | H01L 39/247 505/237 |
| 2012/0065074 A1* | 3/2012 | Xie ....................... | H02G 15/34 505/234 |
| 2016/0005518 A1* | 1/2016 | Daibo ...................... | H01F 6/06 505/211 |

FOREIGN PATENT DOCUMENTS

| | | |
|---|---|---|
| JP | 2008-233025 A | 10/2008 |
| JP | 2009503794 | 1/2009 |
| JP | 2011-113933 A | 6/2011 |
| JP | 2011-136085 A | 7/2011 |

(Continued)

OTHER PUBLICATIONS

Inoue, et al.; "AC Loss Characteristics in Kilohertz Frequency Band of a High-Temperature Superconductor Coil for a Wireless Power Transmission System"; IEEE Transactions of Applied Superconductivity; vol. 27, No. 4, Jun. 2017.

(Continued)

*Primary Examiner* — Paul A Wartalowicz
(74) *Attorney, Agent, or Firm* — Renner, Otto, Boisselle & Sklar, LLP

(57) ABSTRACT

A superconducting wire according to the present disclosure includes: a base material; a superconductor layer formed on each of the respective surfaces of the base material; and a conductive protection layer formed on each of the surfaces of the respective superconductor layers. The thickness of each of the conductive protection layers is 5% or less of the (Continued)

skin depth when a high-frequency current flows through the superconducting wire. The material for forming the conductive protection layer may be, for example, silver.

6 Claims, 19 Drawing Sheets

(56) References Cited

FOREIGN PATENT DOCUMENTS

| | | |
|---|---|---|
| JP | 2012-75304 A | 4/2012 |
| JP | 2012-89713 A | 5/2012 |
| JP | 2016-186905 A | 10/2016 |
| JP | 2017-91808 A | 5/2017 |
| WO | 2007016492 | 2/2007 |

OTHER PUBLICATIONS

Japan Office Action corresponding application No. 2017-140498 dated Feb. 24, 2021, with Machine translation.
Japan Office Action corresponding application No. 2017-140498 dated Sep. 14, 2021, with Machine translation.

* cited by examiner

SUPERCONDUCTING WIRE AND COIL UNIT

INCORPORATION BY REFERENCE

This application is based upon and claims the benefit of priority from Japanese patent application No. 2017-140498, filed on Jul. 20, 2017, the disclosure of which is incorporated herein in its entirety by reference.

BACKGROUND

The present disclosure relates to a superconducting wire and a coil unit, and particularly, to a superconducting wire and a coil unit used in a high-frequency band.

Coils used in a high-frequency band (e.g., several kHz to several hundreds of MHz) include a detection coil for receiving resonance signals of a Magnetic Resonance Imaging (MRI) device or a Nuclear Magnetic Resonance (NMR) device that uses nuclear magnetic resonance, a detection coil of a detection device that detects explosives or illicit drugs using Nuclear Quadrupole Resonance (NQR), and a transmitting/receiving coil used for Wireless Power Transfer (WPT).

The performance (sensitivity and transmission efficiency) of these devices can be improved by using coils having large Q (Quality factor) values (low conductor loss). However, since the coils of these devices are manufactured using copper wires, it is difficult to further reduce the conductor loss. Therefore, an improvement of the performance of devices such as the MRI device, the NMR device, the NQR device, and the WPT device that use coils is reaching the limit.

One of the methods for solving the aforementioned problem is a method of forming a coil using a superconductor. The superconductor generates no loss in a direct current, and generates a conductor loss lower than that of copper by triple digits or more in a high-frequency band. Accordingly, dramatically large Q values can be obtained by using the superconductor for the coil, whereby it can be expected to improve the performance of various types of devices.

"AC Loss Characteristics in Kilohertz Frequency Band of a High-Temperature Superconductor Coil for a Wireless Power Transmission System", IEEE TRANSACTIONS ON APPLIED SUPERCONDUCTIVITY, VOL. 27, NO. 4, JUNE 2017 has reported the results of study that the Q value decreases as a frequency increases when a coil formed using a superconductor is used in a high-frequency band.

SUMMARY

As described in Background, one of the methods for improving the performance of devices such as the MRI device, the NMR device, the NQR device, the WPT device and the like that use coils is a method of using a superconductor as a material of the coil.

However, while the rare earth-based superconducting wire developed for the direct current application that has been practically used generates no loss in a direct current, the conductor loss is large in a high-frequency band, which causes a problem that it is impossible to obtain a large Q value even when the coil is manufactured using the superconductor.

In view of the aforementioned problem, the present disclosure aims to provide a superconducting wire and a coil unit capable of obtaining a large Q value even when they are used in a high-frequency band.

A superconducting wire according to the present disclosure includes: a base material; a superconductor layer formed on each of the respective surfaces of the base material; and a conductive protection layer formed on each of the surfaces of the respective superconductor layers, in which the thickness of each of the conductive protection layers is 5% or less of the skin depth when a high-frequency current flows through the superconducting wire.

A superconducting wire according to the present disclosure includes: a base material; a superconductor layer formed on each of the respective surfaces of the base material; and a dielectric protection layer formed on each of the surfaces of the respective superconductor layers, in which the dielectric protection layer is formed using a material having the value of a dielectric tangent (tan δ) of 0.001 or smaller.

A coil unit according to the present disclosure includes: a coil in which the superconducting wire having the aforementioned structure is wound in a spiral shape; and a support member configured to support the coil. The support member is formed using a dielectric body and includes a plurality of supporting parts that are extended outwardly from the center of the coil.

A coil unit according to the present disclosure includes: a coil formed by winding the superconducting wire having the aforementioned structure; and a support member configured to support the coil, in which the support member is formed using sapphire.

Further, a superconducting wire according to the present disclosure includes: a first wire including a first base material and a first superconductor layer formed on a surface of the first base material; and a second wire including a second base material and a second superconductor layer formed on a surface of the second base material, in which the first and second wires are arranged in such a way that the first and second superconductor layers face outward to each other.

According to the present disclosure, it is possible to provide a superconducting wire and a coil unit capable of achieving a large Q value even when they are used in a high-frequency band.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

<Description of Related Art>

First, related art of the present disclosure will be explained.

Figure 1:
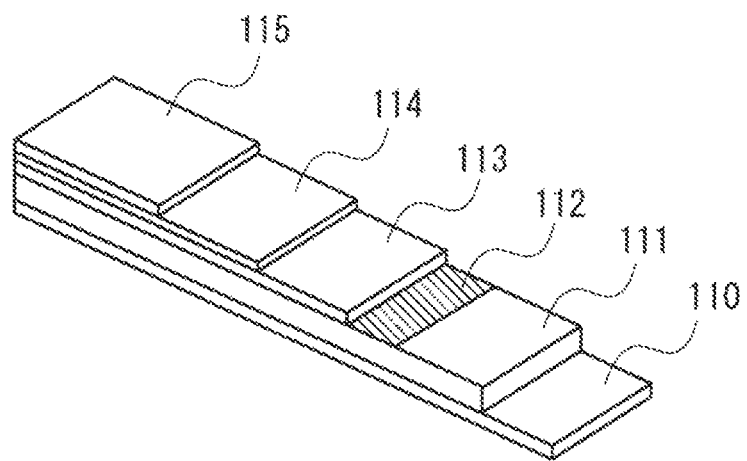
FIG. 1 is a perspective view showing a structure of a superconducting wire according to related art.

FIG. 1 is a perspective view showing a structure of a superconducting wire according to the related art. The superconducting wire shown in FIG. 1 includes a copper layer 110, a Hastelloy 111, an intermediate layer 112, a superconductor layer 113, a silver layer 114, and a copper layer 115, and has a structure in which the respective layers are layered in this order.

The superconducting wire shown in FIG. 1 is a rare earth-based superconducting wire, and a rare earth-based superconductor, specifically, a YBCO-based superconductor, is used for the superconductor layer 113. The rare earth-based superconductor has a crystal structure based on a perovskite structure, and the electrical characteristics of the superconductor depend on the degree of the crystal orientation of the superconductor. Since the Hastelloy 111 is a non-oriented metal base material, the intermediate layer 112 is required in order to epitaxially grow the superconductor on this non-oriented metal base material. The intermediate layer 112 has, for example, a four-layer structure in which $Al_2O_3$, $Y_2O_3$, MgO, and $CeO_2$ are layered in this order.

The Hastelloy 111 is Ni—Cr—Mo alloy (nonmagnetic) and is a material having flexibility and a mechanical strength. Since the superconductor itself is fragile, the superconductor layer 113 needs to be formed on a base material (Hastelloy 111) having some flexibility and mechanical strength in order to form a superconducting wire.

The silver layer 114 and the copper layer 115 are formed on the surface of the superconductor layer 113 as a protection layer and a stabilization layer. Further, the copper layer 110 is formed also on the lower surface of the Hastelloy 111.

Since the conductor loss in the superconducting wire having the structure shown in FIG. 1 becomes large in a high-frequency band while this superconducting wire generates no loss in a direct current, a large Q value cannot be obtained even when the coil is manufactured using the superconductor. The present inventors have manufactured the coil using the superconducting wire having the structure shown in FIG. 1 and investigated the cause of the conductor loss. As a result, it has turned out that, when the superconducting wire is used in a high-frequency band, the high-frequency currents are concentrated on the surface of the superconducting wire (in the case shown in FIG. 1, the copper layers 110 and 115) due to the skin effect, whereby a current does not efficiently flow through the superconductor layer 113 and a large Q value cannot be obtained. Further, even if a superconducting wire that does not include the silver layer 114 or the copper layer 115 is used, the Hastelloy 111 having a resistance 70 times larger than that of copper causes loss, which prevent a large Q value from being obtained.

<Description of Basic Structure of Superconducting Wire of Present Disclosure>

Figure 2:
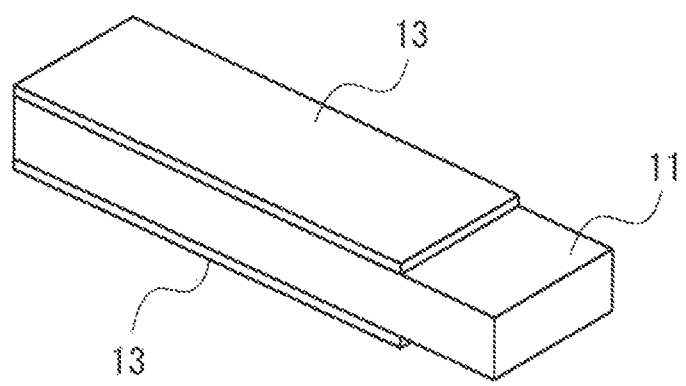
FIG. 2 is a perspective view showing a structure of a superconducting wire according to the present disclosure.

In order to solve the aforementioned problems, the present inventors propose a superconducting wire shown in FIG. 2. In the superconducting wire shown in FIG. 2, the superconductor layer 13 is formed on each of the respective surfaces of the base material 11. For example, Hastelloy can be used for the base material 11. Further, a rare earth-based superconductor (REBCO), more specifically, a YBCO-based superconductor, can be used for the superconductor layer 13. An intermediate layer may be formed between the base material 11 and the superconductor layer 13, similar to the case described with reference to FIG. 1.

As described above, when the superconducting wire is used in a high-frequency band, a high-frequency current flows on the surface of the superconducting wire by the skin effect. However, since the superconductor layer 13 is arranged on the surface of the superconducting wire in the superconducting wire shown in FIG. 2, it is possible to cause a high-frequency current to preferentially flow through the superconductor layer 13. Accordingly, the influence of the base material 11 (Hastelloy), which is the cause of the conductor loss, can be made minimum, whereby a large Q value can be obtained.

<Results of the Simulation of Superconducting Wire According to Present Disclosure (without Support Member)>

Figure 3:
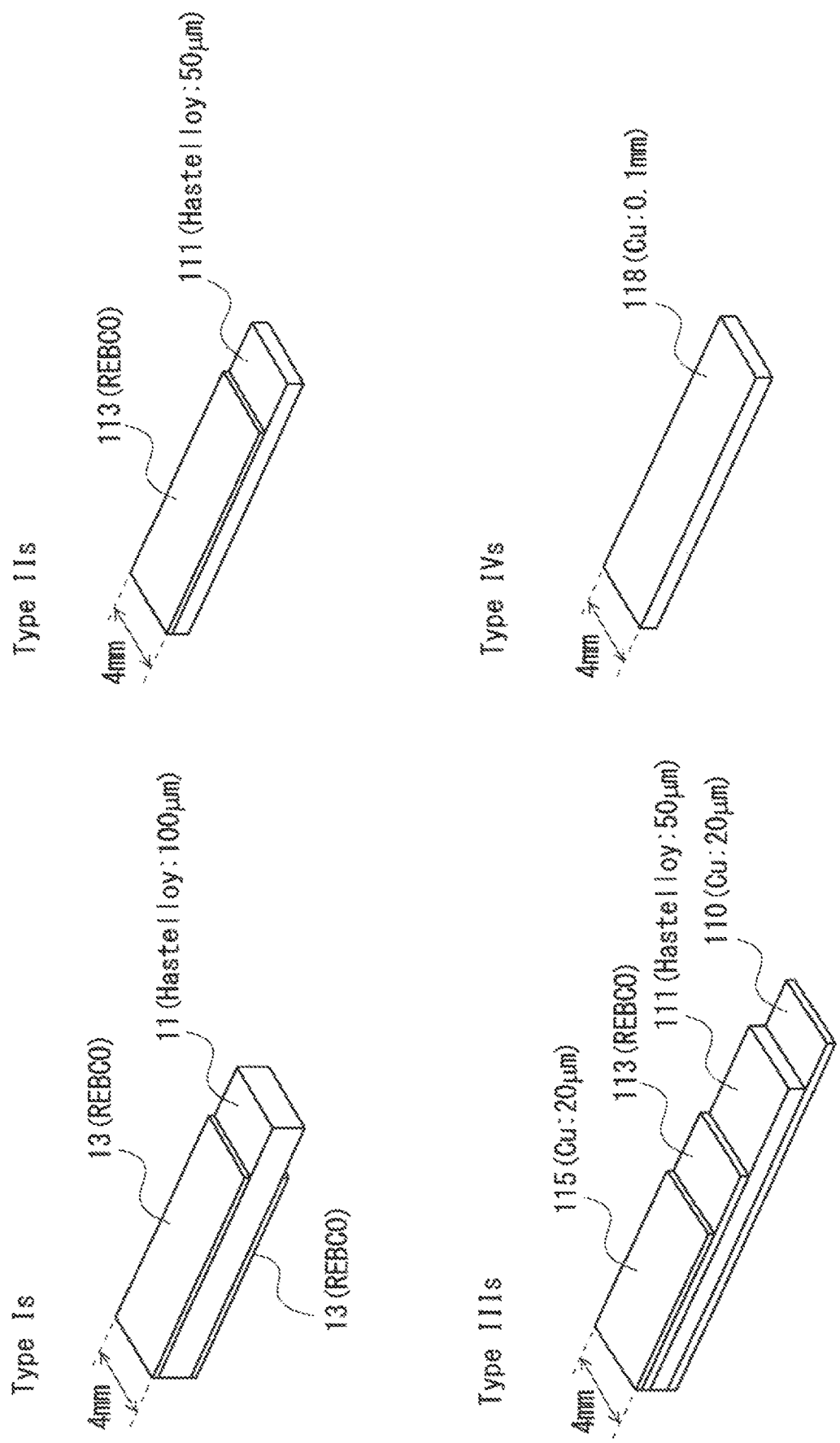
FIG. 3 is a perspective view showing a structure of a superconducting wire where a simulation has been conducted.

The present inventors have conducted simulations in order to study the characteristics of the superconducting wire having a structure shown in FIG. 2. FIG. 3 is a perspective view showing a structure of the superconducting wire where a simulation has been conducted.

The symbol Is in FIG. 3 shows the structure of the type Is (s indicates simulation (simulated)) and corresponds to the superconducting wire having the structure shown in FIG. 2. As shown in FIG. 3, in the type Is, Hastelloy having a thickness of 100 µm is used for the base material 11 and a rare earth-based superconductor (REBCO) is used for the superconductor layer 13. The type Is has a wire width of 4 mm.

The symbol IIs of FIG. 3 shows the structure of the type IIs (comparative example), which is the structure in which the copper layers 110 and 115 and the silver layer 114 have been removed from the structure shown in FIG. 1. As shown in FIG. 3, in the type IIs, Hastelloy having a thickness of 50 µm is used for the base material 111 and a rare earth-based superconductor (REBCO) is used for the superconductor layer 113. The wire width of the type IIs is 4 mm.

The symbol IIIs shown in FIG. 3 shows a structure of the type IIIs (comparative example), which is a structure in which the copper layers 110 and 115 are added to the structure of the type IIs. As shown in FIG. 3, in the type IIIs, a copper layer having a thickness of 20 µm is used for the copper layer 110, Hastelloy having a thickness of 50 µm is used for the base material 111, a rare earth-based superconductor (REBCO) is used for the superconductor layer 113, and a copper layer having a thickness of 20 µm is used for the copper layer 115. The wire width of the type IIIs is 4 mm.

The symbol IVs in FIG. 3 shows the structure of the type IVs (comparative example). The type IVs is a copper wire 118 having a thickness of 0.1 mm and a wire width of 4 mm.

Figure 4:
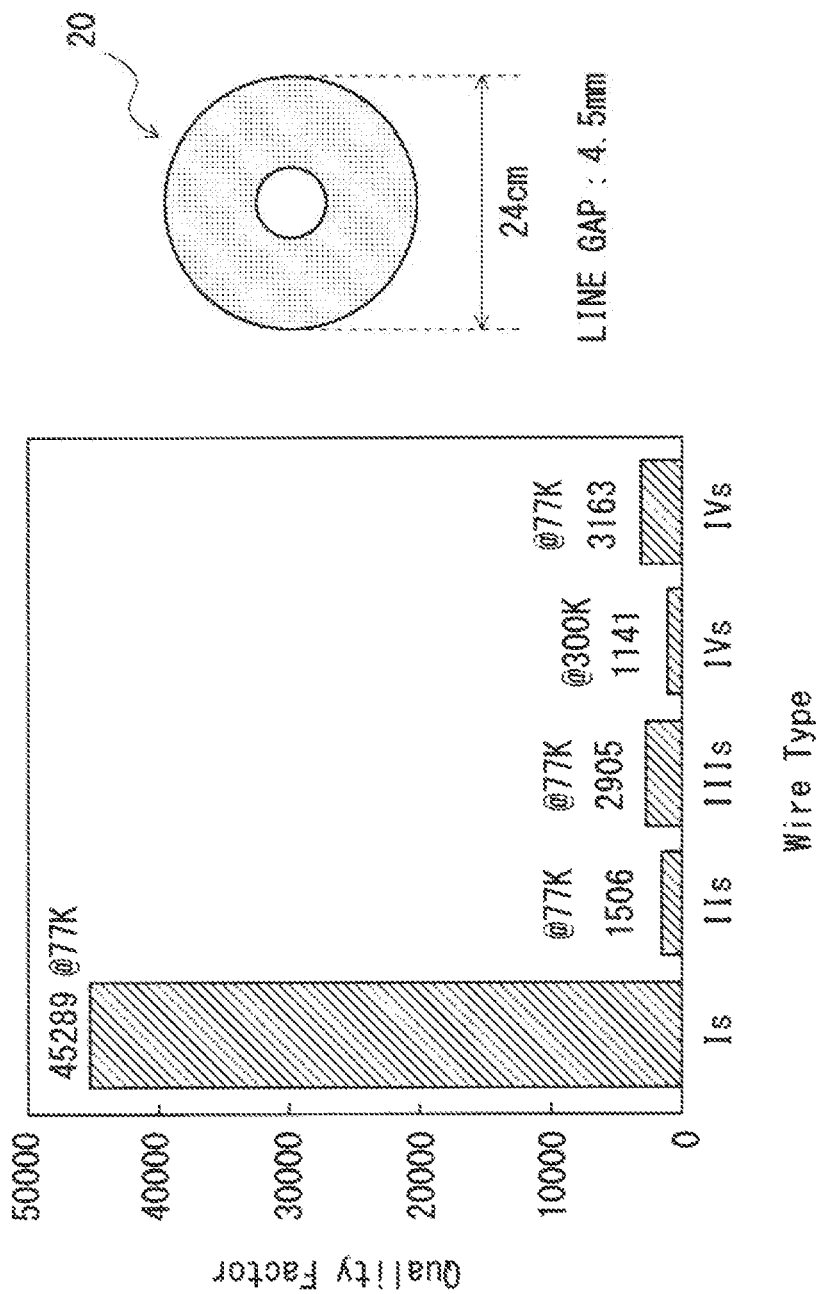
FIG. 4 is a graph showing results of a simulation of the superconducting wire shown in FIG. 3 (in a case in which only the superconducting wire is provided)

FIG. 4 is a graph showing results of the simulation of the superconducting wire shown in FIG. 3. The results of the simulation shown in FIG. 4 show the results of the simulation of the Q value of the coil when the coil 20 (spiral coil, resonance frequency 10 MHz) is designed using the wire having a structure shown in the types Is-IVs in FIG. 3. The coil 20 has a diameter of 24 cm and a line gap of 4.5 mm. A three-dimensional electromagnetic field simulator (CST Studio Suite) is used for the simulation.

The electrical conductivity of the REBCO (YBCO) film formed on a dielectric substrate in 8.5 MHz is $9.0 \times 10^{11}$ (S/m). Since there is no model of the REBCO wire, when the simulation is conducted, this value $9.0 \times 10^{11}$ (S/m) has been used for the electrical conductivity of the REBCO layer of the superconducting wire. Further, the electrical conductivity in 300K (room temperature) and that in 77K (liquid nitrogen temperature) of copper are $5.8 \times 10^7$ and $5.0 \times 10^8$ (S/m), respectively. Further, the electrical conductivity in 77K of Hastelloy is $8.3 \times 10^5$ (S/m). The Q value has been obtained using $Q = f_0/\Delta f$. The symbol $\Delta f$ is a band width of the S21 curve when the simulation is conducted at the level of −3 dB.

As shown in FIG. 4, as the results of the simulation, the Q value of the type Is is 45289, the Q value of the type IIs is 1506, the Q value of the type IIIs is 2905, the Q value in 300K of the type IVs is 1141, and the Q value in 77K of the type IVs is 3163. Accordingly, the Q value of the type Is, which is the structure of the present disclosure, is the highest value, and the Q value has dramatically improved compared to the Q values of other structures. From these results, it can be said that, as in the structure shown in FIG. 2, by arranging the superconductor layer 13 on the surface of the superconducting wire, it is possible to cause the high-frequency current to preferentially flow through the superconductor layer 13, and the influence of the base material 11 (Hastelloy), which is the cause of the conductor loss, can be minimized. Accordingly, in the superconducting wire having the structure shown in FIG. 2, a large Q value can be obtained.

Further, when the Q value (1506) of the type IIs is compared with the Q value (1141) in 300K of the type IVs, the Q value in the type IIs remained to be somewhat larger than the Q value in 300K of the type IVs although the type IIs includes the superconductor layer. It can be considered that the reason for it is because Hastelloy, which is the base material 111, has given a large influence on the conductor loss in the structure of the type IIs.

Further, when the Q value (2905) of the type IIIs is compared with the Q value (3163) in 77K of the type IVs, the Q value becomes smaller than the Q value in 77K of the type IVs although the type IIIs includes the superconductor layer. It can be considered that the reason for it is because the skin depth of the copper layer in 10 MHz is about 21µ and this value is substantially the same as the thickness (20 µm) of the copper layer 115 of the type IIIs. That is, it can be considered that most of the high-frequency currents have flown through the copper layer 115 in the type IIIs. It can be further considered that Hastelloy, which is the base material 111, has also given an influence on the conductor loss in the type IIIs.

<Results of the Simulation of Superconducting Wire of Present Disclosure (with Support Member)>

Figure 5:
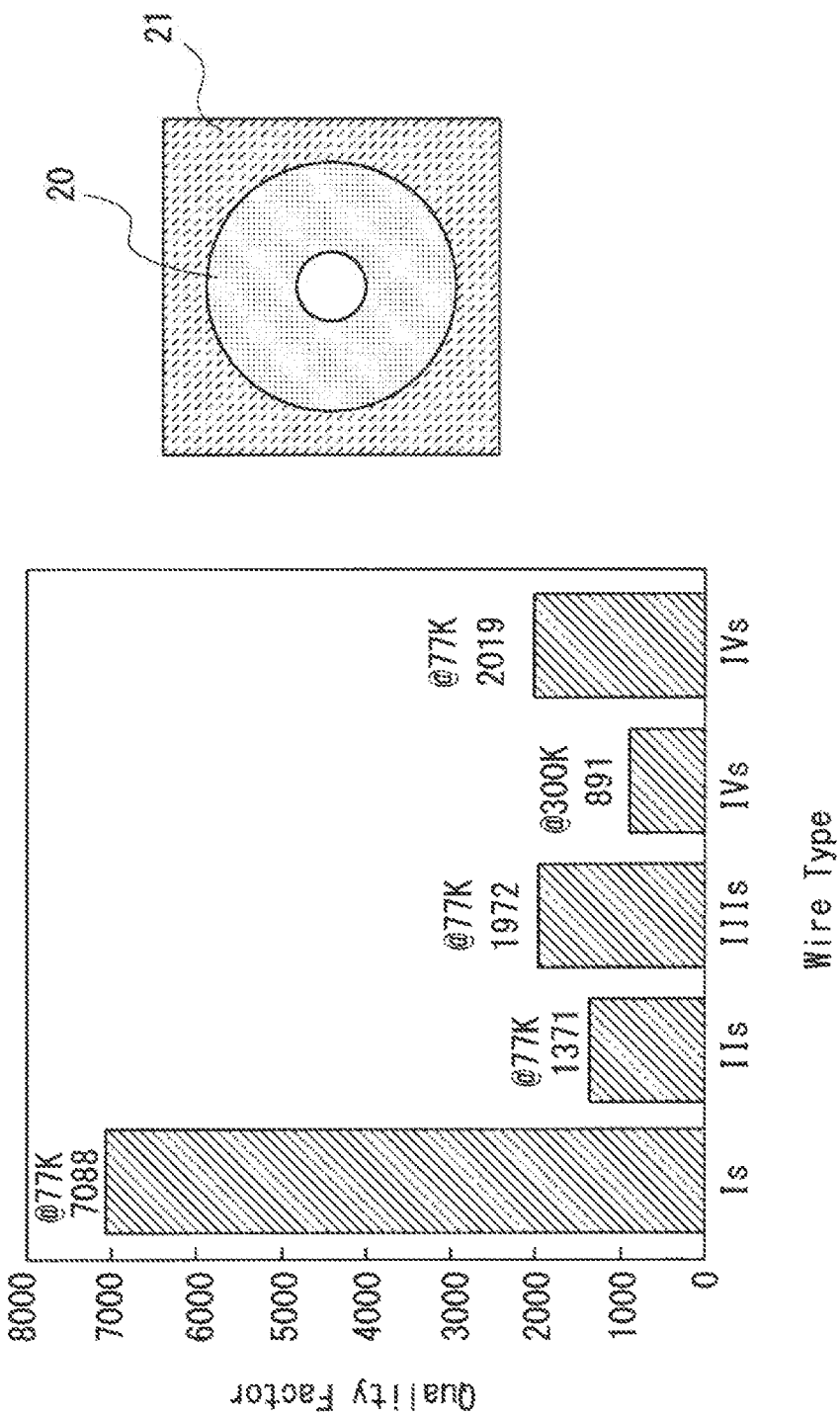
FIG. 5 is a graph showing results of a simulation of the superconducting wire shown in FIG. 3 (in a case in which the superconducting wire is embedded in a support member)

Further, when the coil is manufactured using the superconducting wire, the superconducting wire may be embedded in the support member in order to maintain the shape of the coil. FIG. 5 shows the results of the simulation when the superconducting wire 20 shown in FIG. 3 is embedded in the support member 21. FIG. 5 shows the results of the simulation when expanded polystyrene (dielectric loss: 0.0002) is used for the support member 21.

As shown in FIG. 5, when the support member 21 is used, compared to the case in which the support member 21 is not used (see FIG. 4), the Q value has decreased in all the coils.

It can therefore be said that the Q value of the coil is reduced due to the dielectric loss of the support member 21. The Q value of the coil can be expressed by the following Expression.

$$1/Q = 1/Qd + 1/Qc \qquad \text{Expression 1}$$

The symbol Qd is the Q value due to the dielectric loss of the dielectric body and Qc is the Q value due to the conductor loss of the superconducting wire. From Expression 1, when the dielectric loss is larger than the conductor loss, the Q value is greatly reduced in the results of the simulation shown in FIG. 5 since the dielectric loss becomes dominant.

<Manufacturing of Superconducting Wire and Measurement Results of Present Disclosure>

Figure 6:
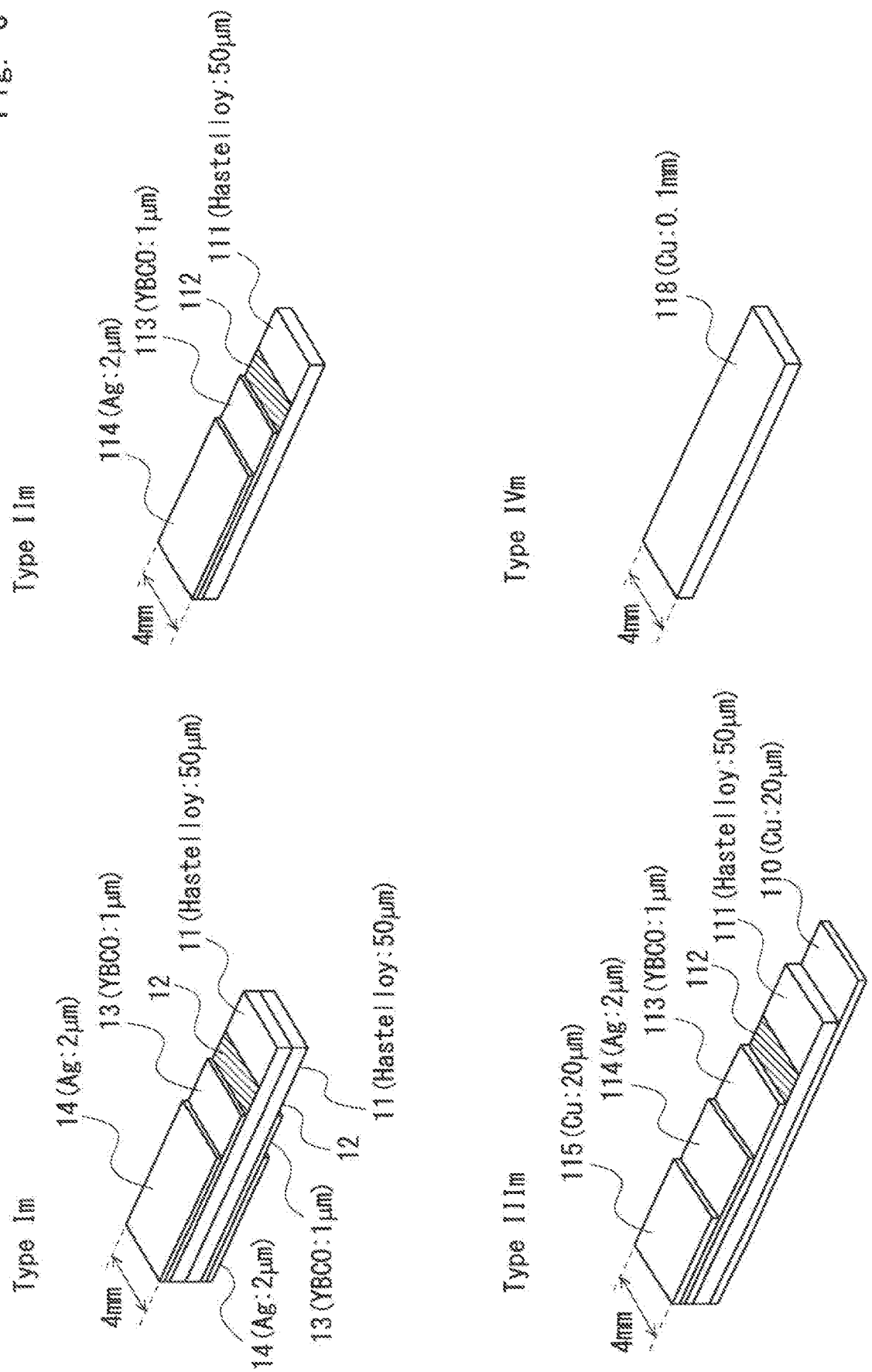
FIG. 6 is a perspective view showing a structure of the superconducting wire actually manufactured.

In order to verify the aforementioned results of the simulation, a superconducting wire having a structure shown in FIG. 6 has been manufactured. FIG. 6 is a perspective view showing a structure of the superconducting wire that has been actually manufactured.

The symbol Im in FIG. 6 indicates the structure of the type Im (m indicates measured) and corresponds to the structure of the type Is shown in FIG. 3. As shown in FIG. 6, in the type Im, Hastelloy having a thickness of 50 μm is used for the base material 11, YBCO having a thickness of 1 μm is used for the superconductor layer 13, and a silver layer having a thickness of 2 μm is used for the conductive protection layer 14. Since the superconducting material is sensitive to moisture or humidity, a conductive protection layer 14 is formed on the superconductor layer 13. An intermediate layer 12 is formed between the base material 11 and the superconductor layer 13. The type Im shown in FIG. 6 is formed by manufacturing two wires the intermediate layer 12, the superconductor layer 13, and the conductive protection layer 14 are formed on the base material 11 and bonding the base materials 11 (Hastelloy) each other in such a way that these two wires are opposed to each other. The type Im has a wire width of 4 mm.

The symbol IIm in FIG. 6 indicates the structure of the type IIm (comparative example) and corresponds to the structure of the type IIs in FIG. 3. As shown in FIG. 6, in the type IIm, Hastelloy having a thickness of 50 μm is used for the base material 111, YBCO having a thickness of 1 μm is used for the superconductor layer 113, and a silver layer having a thickness of 2 μm is used for the conductive protection layer 114. An intermediate layer 12 is formed between the base material 11 and the superconductor layer 13. The type IIm has a wire width of 4 mm.

The symbol IIIm in FIG. 6 indicates the structure of the type IIIm (comparative example) and corresponds to the structure of the type IIIs in FIG. 3. As shown in FIG. 6, in the type IIIm, a copper layer having a thickness of 20 μm is used for the copper layer 110, Hastelloy having a thickness of 50 μm is used for the base material 111, YBCO having a thickness of 1 μm is used for the superconductor layer 113, a silver layer having a thickness of 2 μm is used for the silver layer 114, and a copper layer having a thickness of 20 μm is used for the copper layer 115. The type IIIm has a wire width of 4 mm.

The symbol IVm in FIG. 6 indicates the structure of the type IVm (comparative example) and corresponds to the structure of the type IVs in FIG. 3. The type IVm is a copper wire 118 having a thickness of 0.1 mm and a wire width of 4 mm.

Figure 7:
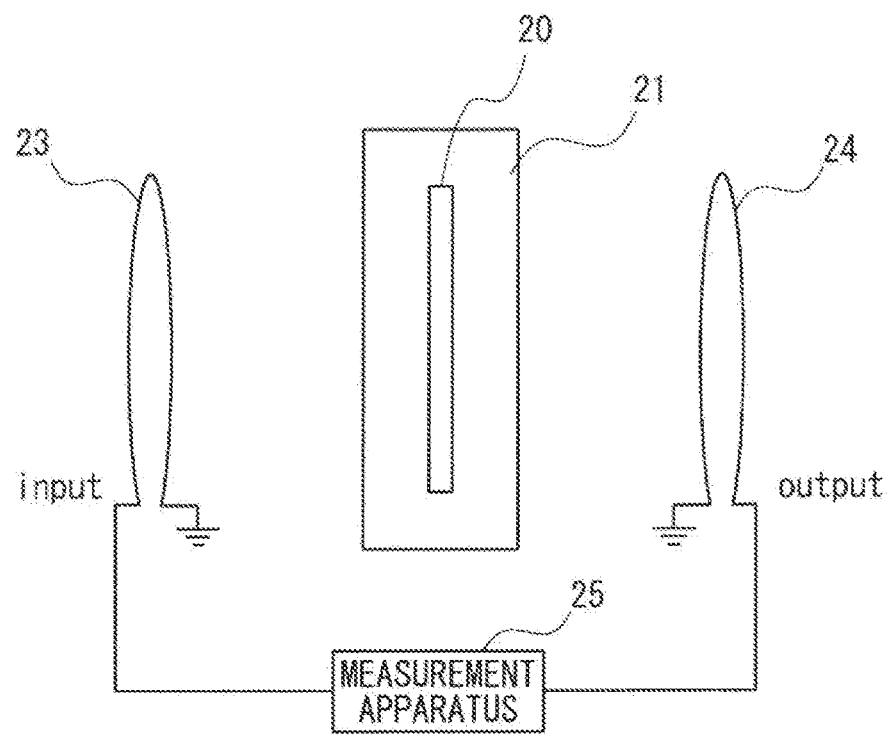
FIG. 7 is a diagram for describing measurement conditions of the superconducting wire shown in FIG. 6.

FIG. 7 is a diagram for describing measurement conditions of the superconducting wire shown in FIG. 6. As shown in FIG. 7, the coil 20 is formed using a wire having a structure shown in the type Im-IVm and this coil 20 is embedded in the support member 21. The diameter of the coil 20 formed here is 24 cm, the line gap thereof is 4.5 mm, the length of the coil is about 10 m, and the resonance frequency is 10 MHz. An input-side loop coil 23 and an output-side loop coil 24 are provided in each of the respective sides of the coil 20. The loop coils 23 and 24 are connected to a measurement apparatus 25. A network analyzer (E5071B: manufactured by Agilent Technologies Japan, Ltd.) is used for the measurement apparatus 25, an input power is 0 dBm (1 mW), and an input/output resistance is 50Ω. The results of measuring the Q value are shown in FIG. 8.

Figure 8:
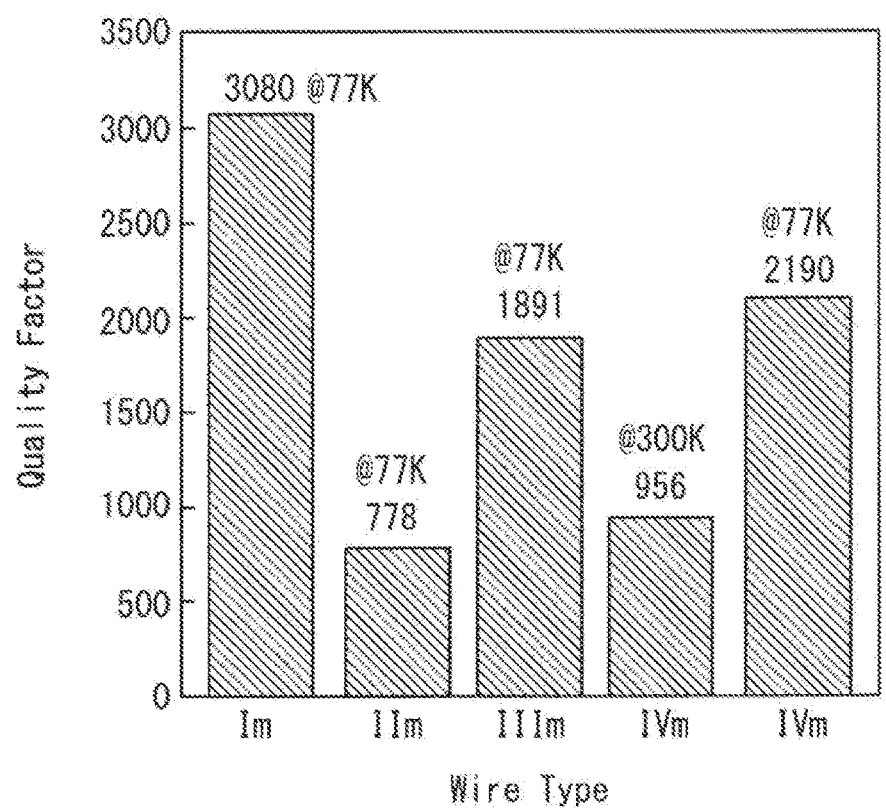
FIG. 8 is a graph showing measurement results of the superconducting wire shown in FIG. 6.

In the measurement results shown in FIG. 8, the Q value of the type Im is 3080, the Q value of the type IIm is 778, the Q value of the type IIIm is 1891, the Q value in 300K of the type IVm is 956, and the Q value in 77K of the type IVm is 2190. Therefore, in the superconducting wire actually manufactured as well, the Q value of the type Im, which is the structure of the present disclosure, is the largest value. Accordingly, it has been verified that the results of the simulation shown in FIG. 5 reflect the measurement results of the superconducting wire actually manufactured.

Further, when the Q values of the type IIIm and the type IVm are focused, these values are close to the Q value obtained in the simulation shown in FIG. 5. On the other hand, when the Q value of the type Im is focused on, the Q value (measured value) of the type Im is 3080, which is smaller than the Q value (7088) obtained in the simulation of the type Is shown in FIG. 5. The reason for it is that, in the type Im shown in FIG. 6, the conductive protection layer (silver layer) 14 is formed on the surface of the superconductor layer 13, a high-frequency current flows in the conductive protection layer (silver layer) 14, and the conductor loss has occurred. That is, since the skin depth in 10 MHz is about 21 μm, the thickness 2 μm of the conductive protection layer (silver layer) 14 corresponds to about 10% of the skin depth. It can be therefore considered that since a part of the high-frequency current has flowed through the conductive protection layer (silver layer) 14, the Q value has become smaller than that of the results of the simulation.

<Study of Thickness of Conductive Protection Layer>

Figure 9:
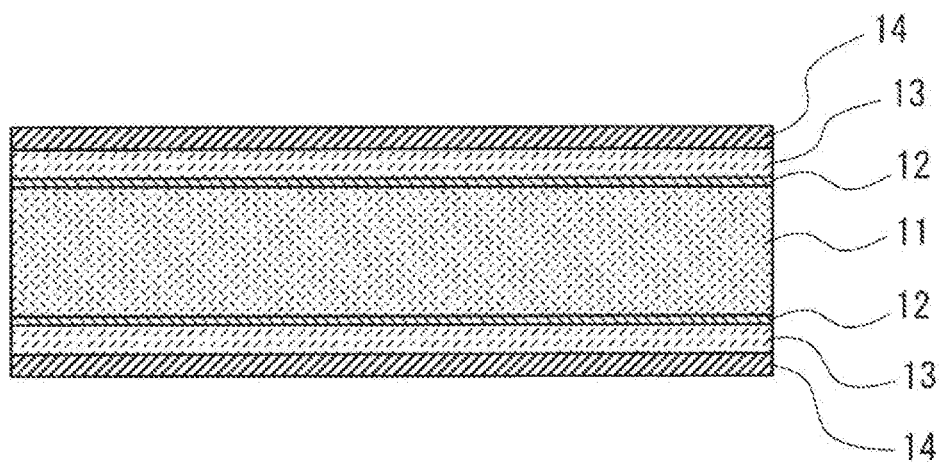
FIG. 9 is a cross-sectional view showing a structure of a superconducting wire according to the embodiment (in a case in which an electrically conductive material is used for a protection layer)

From the aforementioned results of study, a preferable structure of the superconducting wire according to the present disclosure is the one shown in FIG. 9. The superconducting wire shown in FIG. 9 includes a base material 11, a superconductor layer 13 formed on each of the respective surfaces of the base material 11, and a conductive protection layer 14 formed on each of the surfaces of the respective superconductor layers 13. An intermediate layer 12 is formed as appropriate between the base material 11 and the superconductor layer 13.

The superconducting wire shown in FIG. 9 is a rare earth-based superconducting wire and a rare earth-based superconductor, specifically, a YBCO-based superconductor, is used for the superconductor layer 13. The rare earth-based superconductor has a crystal structure based on a perovskite structure, and electrical characteristics of the superconductor depend on the degree of the crystal orientation of the superconductor. When, for example, a non-oriented metal base material is used for the base material 11, the intermediate layer 12 is required to epitaxially grow the superconductor layer 13 on the non-oriented metal base material. For example, the intermediate layer 112 has a four-layer structure in which $Al_2O_3$, $Y_2O_3$, MgO, and $CeO_2$ are layered in this order.

Further, for example, Hastelloy can be used for the base material 11. Hastelloy, which is Ni—Cr—Mo alloy (nonmagnetic), is a material having flexibility and a mechanical strength. Since the superconductor itself is fragile, the superconductor layer 13 needs to be formed on a base material having a certain level of flexibility and mechanical strength in order to form the superconducting wire.

The conductive protection layer 14 is formed on the surface of the superconductor layer 13 as a protection layer. The conductive protection layer 14 is a layer for protecting the superconductor layer 13 from moisture or humidity.

In the superconducting wire according to the present disclosure, the superconductor layer 13 is arranged on each of the respective surfaces of the base material 11. As described above, when the superconducting wire is used in a high-frequency band, a high-frequency current flows on the surface of the superconducting wire by the skin effect. However, in the superconducting wire according to the present disclosure, the superconductor layer 13 is arranged on each of the respective surfaces of the base material 11, whereby it is possible cause a high-frequency current to preferentially flow through the superconductor layer 13. Accordingly, the influence of the base material 11 (Hastelloy), which is the cause of the conductor loss, can be minimized, whereby it is possible to obtain a large Q value.

When the skin effect is taken into account, as shown in the results of the simulation shown in FIGS. 3 and 4, it is preferable not to provide anything on the surface of the superconductor layer 13. However, since the superconductor material is sensitive to moisture or humidity, a protection layer needs to be formed on the surface of the superconductor layer 13 when the superconducting wire is actually manufactured. However, the Q value of the coil (coil formed using a superconducting wire) may be degraded depending on the thickness of the conductive protection layer formed on the surface of the superconductor layer 13, as shown in the results of study shown in FIGS. 6 and 8.

Figure 10:
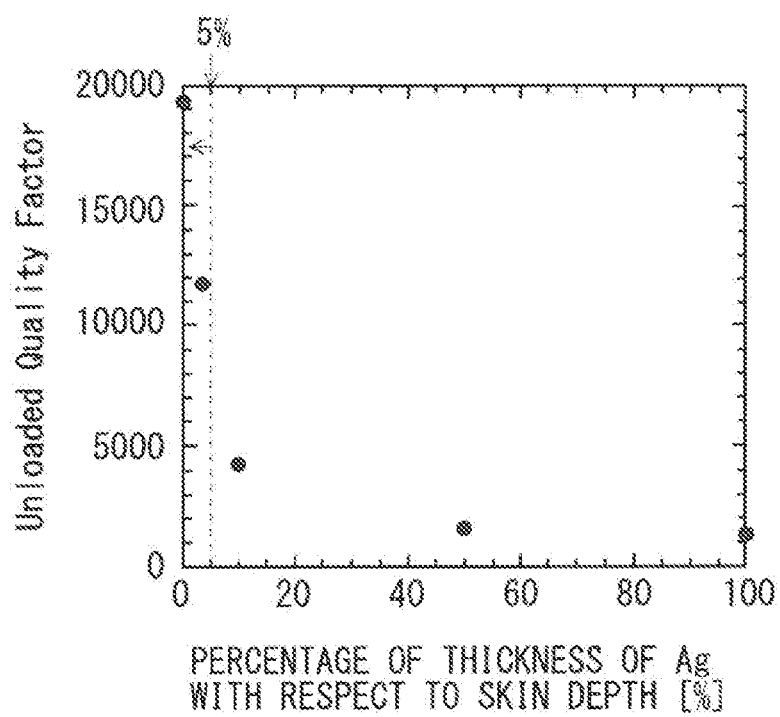
FIG. 10 is a graph showing results of a simulation of a relation between a percentage of a thickness of Ag with respect to a skin depth and a Q value.

The present inventors have studied the thickness of the conductive protection layer 14 shown in FIG. 9 in detail. FIG. 10 is a graph showing results of the simulation of the percentage of the thickness of the conductive protection layer (silver layer) 14 with respect to the skin depth and the Q value. FIG. 10 shows the results of the simulation in a case in which the silver layer 14 is provided on each of the respective surfaces of the conductor where superconductivity is assumed (without Hastelloy) and the thickness of this silver layer 14 is changed in order to simplify the calculations of the simulation.

According to the results of the simulation shown in FIG. 10, the Q value of the coil has increased as the percentage of the thickness of the conductive protection layer (silver layer) 14 with respect to the skin depth becomes smaller, that is, as the conductive protection layer (silver layer) 14 becomes thinner. It has turned out that, when, in particular, the percentage of the thickness of the conductive protection layer (silver layer) 14 with respect to the skin depth becomes 10% or less, the Q value is dramatically improved (increased). In the present disclosure, the thickness of each of the conductive protection layers 14 is preferably set to 5% or less of the skin depth when a high-frequency current flows through the superconducting wire. In order to obtain the Q value of 10000 or larger, in particular, the thickness of each of the conductive protection layers 14 is preferably set to 3% or less of the skin depth.

On the other hand, when the thickness of the conductive protection layer 14 is made too thin, the function of the conductive protection layer 14 as a protection layer is reduced. Therefore, it is required that the thickness of the conductive protection layer 14 be equal to or larger than the thickness at which the conductive protection layer 14 is able to protect the superconductor layer 13. Preferably, the thickness of the conductive protection layer 14 is, for example, 0.1 μm or larger. When gold is used as the material of the conductive protection layer 14, gold can be deposited in such a way that it has a thin thickness. In this case, the film thickness of the conductive protection layer 14 may be set to, for example, about 0.01 μm.

The skin depth d, which is a depth in which the current becomes 1/e (about 0.37) of the surface current, can be calculated using the following Expression 2.

$$d = \{2\rho/(\omega \cdot \mu)\}^{1/2} \qquad \text{Expression 2}$$

The symbol ρ indicates the electrical resistivity of the conductor, ω indicates the angular frequency of the current (=2π×frequency), and μ indicates the absolute permeability of the conductor. As shown in Expression 2, as the frequency of the current that flows through the conductor becomes higher, the skin depth d becomes smaller. On the other hand, as the frequency of the current that flows through the conductor becomes lower, the skin depth d becomes larger. Further, as the electrical resistivity of the conductor becomes smaller, the skin depth d becomes smaller. On the other hand, as the electrical resistivity of the conductor becomes larger, the skin depth d becomes larger.

As described above, the skin depth when the high-frequency current flows through the conductor depends on the frequency of the current that flows through the conductor and the electrical resistivity of the conductor. For example, the skin depth in 10 MHz of the structure of the type Im in FIG. 6 is about 20 μm. The value of the skin depth is a value approximated using the physical property value of silver, which is a protection film. The skin depth in 10 MHz of copper is 20 μm, and the value of the skin depth of silver and that of copper are close to each other.

In this case, by setting the thickness of the conductive protection layer (silver layer) 14 to be 5% or less of the skin depth, that is, by setting this thickness to be 1 μm or smaller, the Q value of the superconducting wire can be made large. Further, by setting the thickness of the conductive protection layer (silver layer) 14 to be 3% or less of the skin depth, that is, setting this thickness to be 0.6 μm or smaller, the Q value of the superconducting wire can be further increased.

The material that forms the conductive protection layer 14 in the present disclosure is not limited to silver and any electrically conductive material may be used as long as it allows the Q value of the superconducting wire to be increased (that is, an electrically conductive material having an appropriate thickness and a material having a high electrical conductivity). The conductive protection layer 14 may be, for example, gold.

<Study for Insulator Protection Layer>

Figure 11:
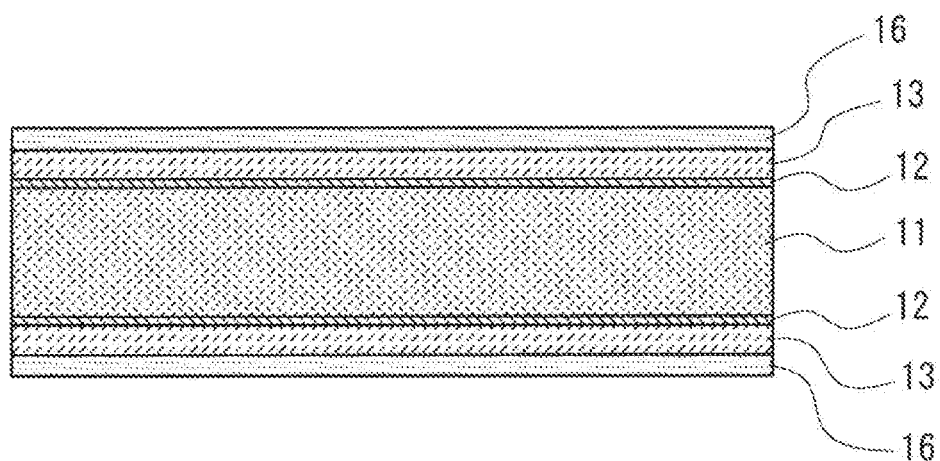
FIG. 11 is a cross-sectional view showing a structure of the superconducting wire according to the present disclosure (in a case in which a dielectric material is used for a protection layer)

Further, in the present disclosure, an insulator protection layer may be used in place of the conductive protection layer as a protection layer that protects the superconductor layer 13. FIG. 11 is a cross-sectional view showing a structure of the superconducting wire and shows a structure in which a dielectric material is used for the protection layer. The superconducting wire shown in FIG. 11 includes a base material 11, a superconductor layer 13 formed in each of the respective surfaces of the base material 11, and a dielectric protection layer 16 formed on each of the surfaces of the respective superconductor layers 13. An intermediate layer 12 is formed as appropriate between the base material 11 and the superconductor layer 13. Since the base material 11, the intermediate layer 12, and the superconductor layer 13 in the superconducting wire shown in FIG. 11 are similar to the base material 11, the intermediate layer 12, and the superconductor layer 13 of the superconducting wire shown in FIG. 9, overlapping descriptions thereof will be omitted.

A dielectric protection layer 16 is formed on the surface of the superconductor layer 13 as a protection layer. The dielectric protection layer 16 is a layer to protect the superconductor layer 13 from moisture or humidity.

When the dielectric loss is taken into account, as shown in the results of the simulation shown in FIGS. 3 and 4, it is preferable not to provide anything on the surface of the superconductor layer 13. However, since the superconductor material is sensitive to moisture or humidity, a protection layer needs to be formed on the surface of the superconductor layer 13 when the superconducting wire is actually manufactured. However, the Q value of the superconducting wire may be degraded depending on the dielectric protection layer formed on the surface of the superconductor layer 13.

Figure 12A:
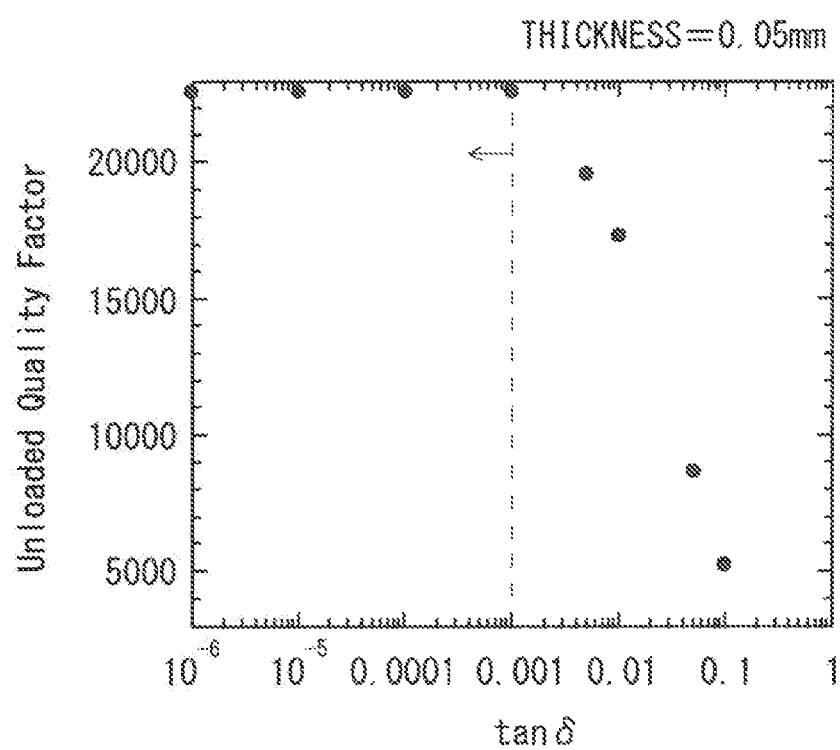
FIG. 12A is a graph showing a relation between tan δ of a dielectric protection layer and the Q value (results of the simulation)
Figure 12B:
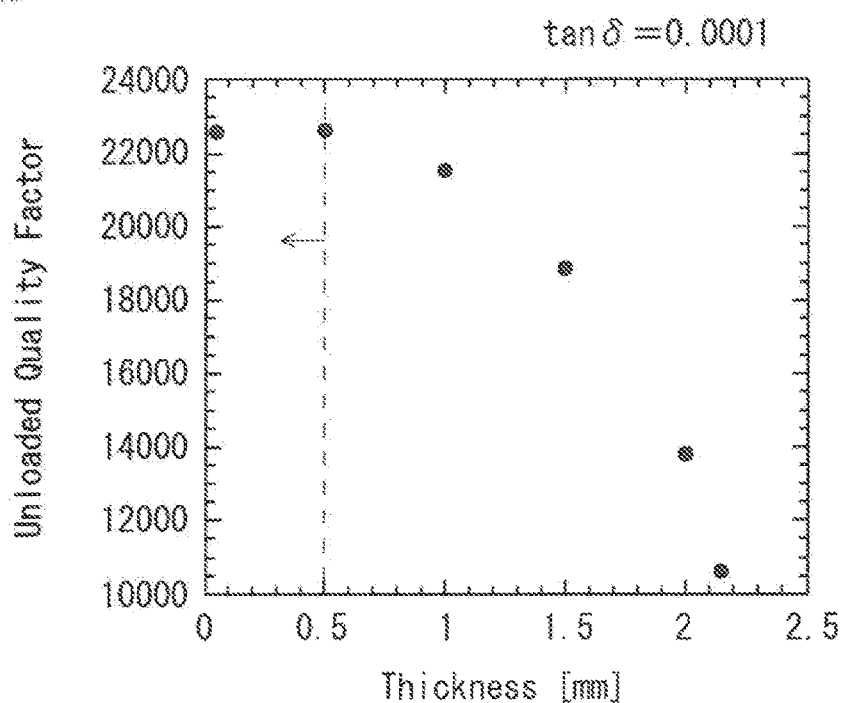
FIG. 12B is a graph showing a relation between a thickness of the dielectric protection layer and the Q value (results of the simulation)
Figure 12C:
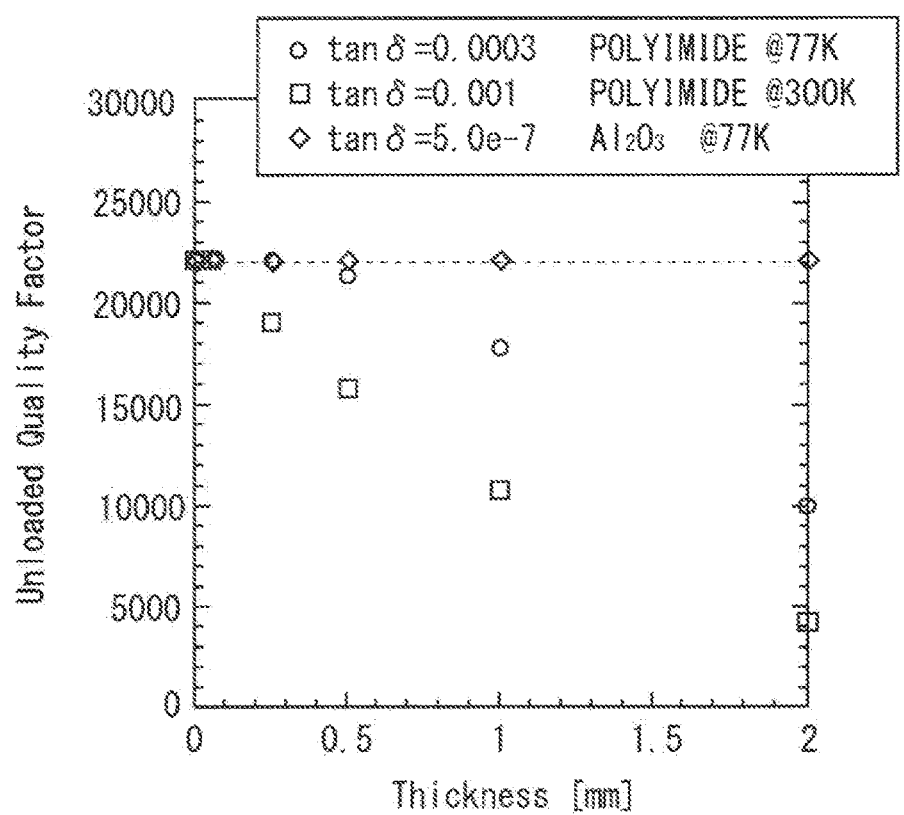
FIG. 12C is a graph showing a relation between the thickness of the dielectric protection layer and the Q value (results of the simulation)

The present inventors have studied the dielectric protection layer 16 shown in FIG. 11 in detail. FIG. 12A is a graph showing results of the simulation of the relation between the dielectric tangent (tan $\delta$) of the dielectric protection layer 16 and the Q value. In the simulation shown in FIG. 12A, the thickness of the dielectric protection layer 16 is set to 0.05 mm. FIGS. 12A-12C described below show the results of the simulations in a case in which the dielectric protection layer 16 is provided on each of the respective surfaces of the conductor (without Hastelloy) where superconductivity is assumed and the thickness of this dielectric protection layer 16 is changed in order to simplify the calculations of the simulations.

According to the results of the simulation shown in FIG. 12A, the Q value of the superconducting wire becomes high when tan $\delta$ of the dielectric protection layer 16 is 0.001 or smaller. Further, the Q value of the superconducting wire is saturated in a high value when tan $\delta$ of the dielectric protection layer 16 is 0.001 or smaller. On the other hand, when tan $\delta$ of the dielectric protection layer 16 becomes larger than 0.001, the Q value of the superconducting wire has been degraded.

FIG. 12B is a graph showing results of the simulation of the relation between the thickness of the dielectric protection layer 16 and the Q value. In the simulation shown in FIG. 12B, tan $\delta$ of the dielectric protection layer 16 is 0.0001.

According to the results of the simulation shown in FIG. 12B, the Q value of the superconducting wire becomes high when the thickness of the dielectric protection layer 16 is smaller than 0.5 mm. Further, the Q value of the superconducting wire is saturated in a high value when the thickness of the dielectric protection layer 16 is 0.5 mm or smaller. On the other hand, when the thickness of the dielectric protection layer 16 becomes larger than 0.5 mm, the Q value of the superconducting wire has been degraded.

As shown in FIG. 12A, as the value of tan $\delta$ of the dielectric protection layer 16 decreases, the Q value of the superconducting wire increases. Further, as shown in FIG. 12B, as the thickness of the dielectric protection layer 16 becomes thinner, the Q value of the superconducting wire increases. Therefore, when the results of the simulation shown in FIG. 12A is taken into account, the dielectric protection layer 16 is preferably formed using a material having the value of tan $\delta$ of 0.001 or smaller. In particular, the dielectric protection layer 16 is more preferably formed using a material having a value of tan $\delta$ of 0.001 or smaller and a thickness of 0.05 mm or smaller.

Further, when the results of the simulation shown in FIG. 12B is taken into account, the dielectric protection layer 16 is preferably formed of a material having a value of tan $\delta$ of 0.0001 or smaller and a thickness of 0.5 mm or smaller.

On the other hand, when the thickness of the dielectric protection layer 16 is made too thin, the function of the dielectric protection layer 16 as the protection layer is reduced. Therefore, the thickness of the dielectric protection layer 16 needs to have a thickness equal to or larger than the thickness at which the dielectric protection layer 16 can protect the superconductor layer 13.

The dielectric protection layer 16 can be formed of, for example, polystyrene or polyimide. Here, tan $\delta$ of polystyrene is 0.0001, the results of the simulation shown in FIG. 12B are the results of the simulation in which it is assumed that polystyrene is used for the dielectric protection layer 16. From the results of the simulation shown in FIG. 12B, polystyrene preferably has a thickness of 0.5 mm or smaller.

FIG. 12C are results of the simulation indicating the relation between the thickness of the dielectric protection layer 16 and the Q value when polyimide and sapphire ($Al_2O_3$) are used for the dielectric protection layer 16. In the simulation shown in FIG. 12C, tan $\delta$ of polyimide in 77K is set to 0.0003. Further, tan $\delta$ of polyimide in 300K is set to 0.001. Further, tan $\delta$ of sapphire in 77K is set to $5.0\times10^{-7}$.

Here, tan $\delta$ of polyimide in 300K is 0.001, and this result corresponds to the results of the simulation in FIG. 12A. Therefore, in this case, the dielectric protection layer 16 preferably has a thickness of 0.05 mm or smaller.

Further, tan $\delta$ of polyimide in 77K is 0.0003, which is smaller than tan $\delta$ of polyimide in 300K. Therefore, when the target value of the Q value is set to 22000, the thickness of the dielectric protection layer 16 is preferably set to 0.4 mm or smaller.

Further, tan $\delta$ of sapphire in 77K is $5.0\times10^{-7}$, which is extremely smaller than tan $\delta$ of polyamide or polyimide. Accordingly, in the results of the simulation shown in FIG. 12C, a large Q value has been obtained even when the film thickness is 2 mm. When sapphire is actually formed, a vacuum deposition equipment such as a sputtering equipment is typically used. In reality, the sapphire film has a thickness of about tens of nm to several µm.

Alternatively, the dielectric protection layer 16 may be made of a material other than sapphire (e.g., magnesium oxide or cerium oxide). For example, tan $\delta$ of magnesium oxide in 77K is $5.0\times10^{-5}$.

In the present disclosure, the materials of the dielectric protection layer 16 are not limited to the aforementioned ones and may be any material as long as the Q value of the superconducting wire can be increased (that is, a material having an appropriate tan $\delta$ and thickness).

<Study of Size of Hastelloy>

In the present disclosure, Hastelloy is used as the base material of the superconducting wire. Hastelloy is Ni—Cr—Mo alloy (nonmagnetic), and has flexibility and a mechanical strength. Therefore, Hastelloy can be suitably used for the base material of the superconducting wire. However, Hastelloy is a material having a resistance 70 times larger than that of copper, and thus the Q value of the superconducting wire may be degraded unless Hastelloy is made to have an appropriate size.

The present inventors have conducted the following simulations in order to study the appropriate size of Hastelloy used for the base material of the superconducting wire.

Figure 13:
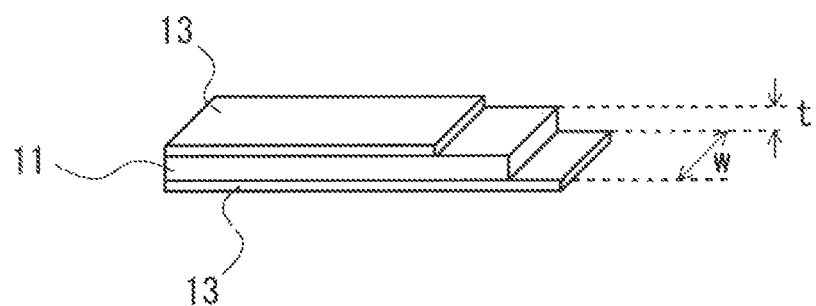
FIG. 13 is a perspective view showing a structure of the superconducting wire where a simulation has been conducted.

FIG. 13 is a perspective view showing a structure of the superconducting wire where a simulation has been conducted. The present inventors have conducted a simulation for a superconducting wire having a structure in which the superconductor layer (REBCO) 13 is provided on each of the respective surfaces of the base material (Hastelloy) 11 shown in FIG. 13.

Figure 14A:
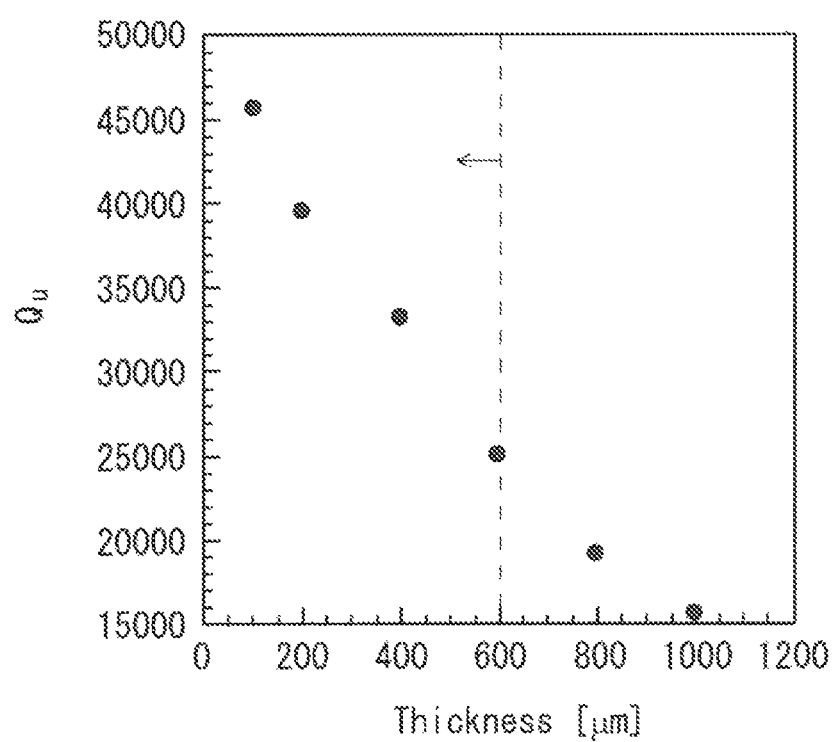
FIG. 14A is a graph showing a relation between a thickness of Hastelloy and the Q value (results of the simulation)

FIG. 14A is a graph (results of the simulation) showing a relation between the thickness t of Hastelloy and the Q value. The structure shown in FIG. 13 corresponds to the structure of the type Is in FIG. 3, and the simulation conditions shown in FIG. 14A are similar to the simulation conditions for the type Is shown in FIG. 3 except that the size of Hastelloy is changed.

As shown in the results of the simulation shown in FIG. 14A, the Q value of the superconducting wire becomes larger as the thickness t of Hastelloy becomes thinner. In other words, the Q value of the superconducting wire becomes smaller as the thickness t of Hastelloy increases. It can be considered that the reason for it is because the loss of the superconducting wire increases when Hastelloy becomes thicker.

For example, in the results of the simulation shown in FIG. 14A, in order to make the Q value of the superconducting wire (coil) be equal to or larger than 25000, Hastelloy needs to have a thickness of 600 μm or smaller. On the other hand, when the thickness t of Hastelloy is too small, the strength of Hastelloy decreases. When this point is taken into account, in this disclosure, Hastelloy preferably has a thickness of 100 μm-600 μm, and more preferably has a thickness of 100 μm-200 μm.

Figure 14B:
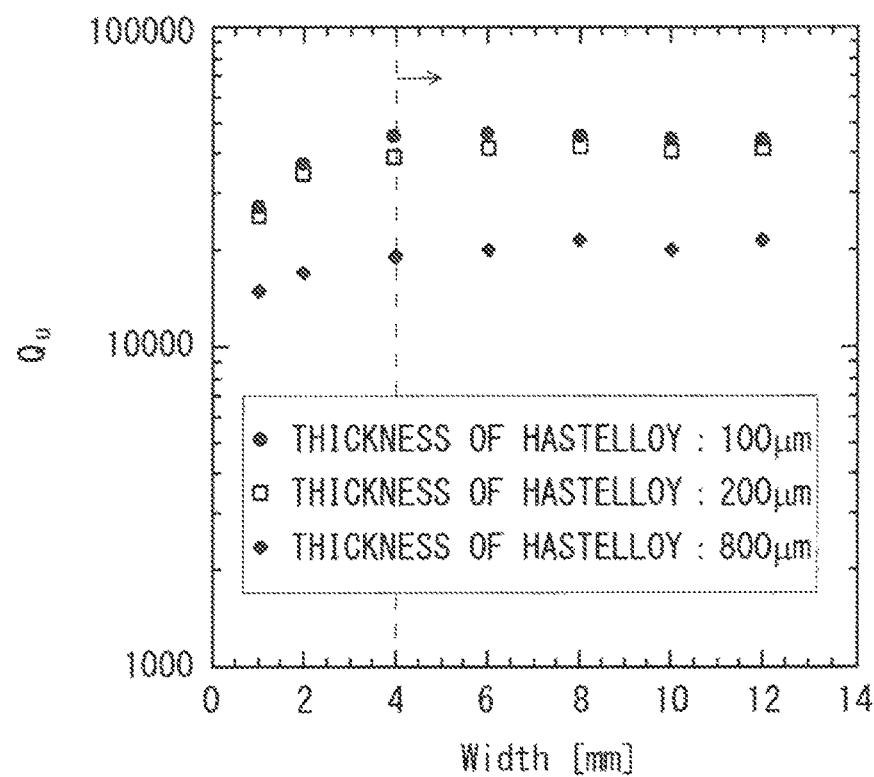
FIG. 14B is a graph showing a relation between a width of Hastelloy and the Q value (results of the simulation)

The present inventors have also studied the width w of the Hastelloy 11. FIG. 14B is a graph showing a relation between the width w of Hastelloy and the Q value. The results of the simulation shown in FIG. 14B show the results of cases in which the thickness t of Hastelloy is 100 μm, 200 μm, and 800 μm. The conditions in which the simulation in FIG. 14B is performed are similar to the simulation conditions with respect to the type Is shown in FIG. 3 except that the size of Hastelloy has been changed.

As shown in the results of the simulation shown in FIG. 14B, in Hastelloy of every thickness, when the width w of Hastelloy is equal to or larger than 4 mm, the Q values of the superconducting wire (coil) are large values. Therefore, when the superconducting wire is formed using Hastelloy, the width w of Hastelloy is preferably set to 4 mm or larger.

<Study of Shape of Support Member>

When the coil is manufactured using the superconducting wire, the superconducting wire may be embedded in the support member in order to maintain the shape of the coil. However, as shown in the results of the simulation shown in FIG. 5, when the superconducting wire is embedded in the support member, the Q value of the coil is reduced due to the dielectric loss of the support member. In order to reduce the influence of the dielectric loss of the support member, it is important to reduce the amount (volume) of the support member. The present inventors have studied the shape for reducing the dielectric loss of the support member.

Figure 15A:
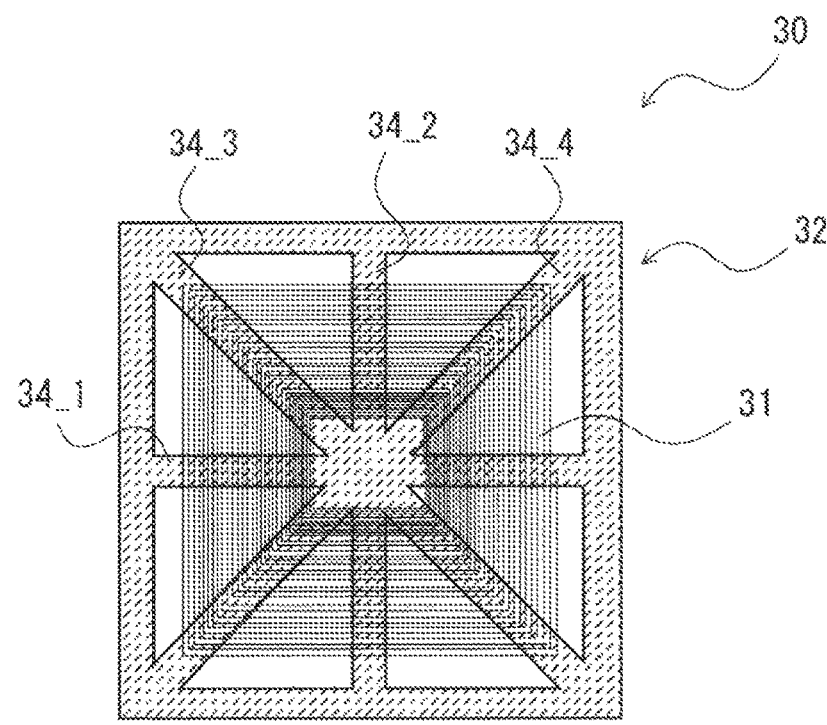
FIG. 15A is a diagram showing a configuration example of a coil unit.

FIG. 15A is a diagram showing a configuration example of a coil unit 30 including a coil 31 and a support member 32 that supports the coil 31. The coil unit 30 shown in FIG. 15A uses the coil 31 in which the superconducting wire described above is wound in a spiral shape. Further, the support member 32 shown in FIG. 15A is formed using a dielectric material. For example, expanded polystyrene that can be easily processed may be used for the dielectric material. The support member 32 includes a plurality of supporting parts that are extended outwardly from the center of the coil 31.

In the coil unit 30 shown in FIG. 15A, the support member 32 includes four supporting parts 34_1-34_4 intersect with one another at the center of the coil 31. In this configuration, the support member 32 supports the coil 31 in eight parts (that is, two parts at each of the supporting parts 34_1-34_4). Accordingly, the size of a part where the coil 31 contacts the support member 32 can be reduced compared to that of the case shown in FIG. 5, whereby the dielectric loss of the support member 32 can be reduced.

In the structure shown in FIG. 15A, the supporting part 34_1 that is extended in the horizontal direction and the supporting part 34_2 that is extended in the vertical direction can be omitted as long as the strength of the support member 32 can be maintained. That is, the coil 31 may be supported using the two supporting parts 34_3 and 34_4 extending in an oblique direction. In this case, the size of the part where the coil 31 contacts the support member 32 can be further reduced, whereby the dielectric loss of the support member 32 can be reduced. Further, the support member 32 shown in FIG. 15A may be made of sapphire.

Figure 15B:
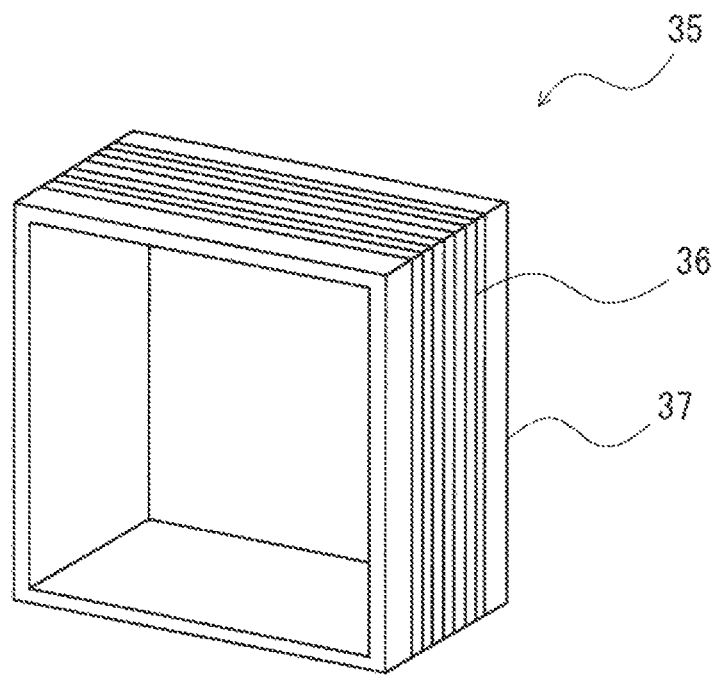
FIG. 15B is a diagram showing another configuration example of the coil unit.

FIG. 15B is a diagram showing another configuration example of a coil unit 35 that includes a coil 36 and a support member 37 that supports the coil 36. In the coil unit 35 shown in FIG. 15B, the coil 36 is wound around the outer circumference of the support member 37. The aforementioned superconducting wire is used for the coil 36. Further, a dielectric material, more preferably, sapphire, can be used for the support member 37. While the dielectric loss of expanded polystyrene (polystyrene) is, for example, 0.0002, the dielectric loss of sapphire is $5.0 \times 10^{-7}$, which is extremely low. Therefore, by forming the support member 37 using sapphire, the influence of the dielectric loss of the support member 37 can be reduced, whereby it is possible to prevent the Q value of the coil 36 from being reduced due to the dielectric loss of the support member 37.

The present inventors have conducted a simulation of the Q value of the coil 36 in a case in which expanded polystyrene is used for the support member 37 and a case in which sapphire is used for the support member 37. In both cases, the support member 37 has a thickness of 10 mm. Further, the dielectric loss of expanded polystyrene and that of sapphire have the aforementioned value. As shown in the results of the simulation, the Q value of the coil 36 when expanded polystyrene is used for the support member 37 is 10667. On the other hand, the Q value of the coil 36 when sapphire is used for the support member 37 is 57890. From these results of the simulation, the Q value of the coil 36 when sapphire is used for the support member 37 is much larger than that of the case in which expanded polystyrene is used for the support member 37.

Further, the Q value of the coil 36 when the support member 37 is not provided, that is, the Q value of only the coil 36 is 57919. Accordingly, the Q value of the coil 36 (57890) when sapphire is used for the support member 37 is quite close to the Q value of only the coil (57919), from which it has been confirmed that the dielectric loss due to the support member 37 is substantially negligible when sapphire is used for the support member 37.

The configuration examples of the support member 30 shown in FIGS. 15A and 15B are merely examples and the support member may have another shape in the present disclosure. For example, while the support member 37 has a rectangular cross section in the coil unit 35 shown in FIG. 15B, the cross-sectional shape of the support member 37 may be a circular shape. In this case, the shape of the support member 37 may be a cylindrical shape. Further, when the support member 37 is formed using sapphire, it may be formed using a plurality of pieces of sapphire having a stick shape. That is, since it is difficult to form sapphire having a large size, a plurality of pieces of sapphire having a stick shape, each having a relatively small size, may be formed, and they may be arranged in such a way that they form the shape of the support member 37, whereby the support member 37 may be formed.

By using the superconductor wire and the coil unit having the structures described above, it is possible to obtain a large Q value even when they are used in a high-frequency band.

<Specific Configuration Example of Superconducting Wire>

Next, a specific configuration example of the superconducting wire will be explained.

FIGS. 16A-16D are cross-sectional views showing a specific configuration example of the superconducting wire according to the embodiment (cross-sectional views taken along the plane perpendicular to the longitudinal direction of the superconducting wire). First, the configuration example shown in FIG. 16A will be explained.

Figure 16A:
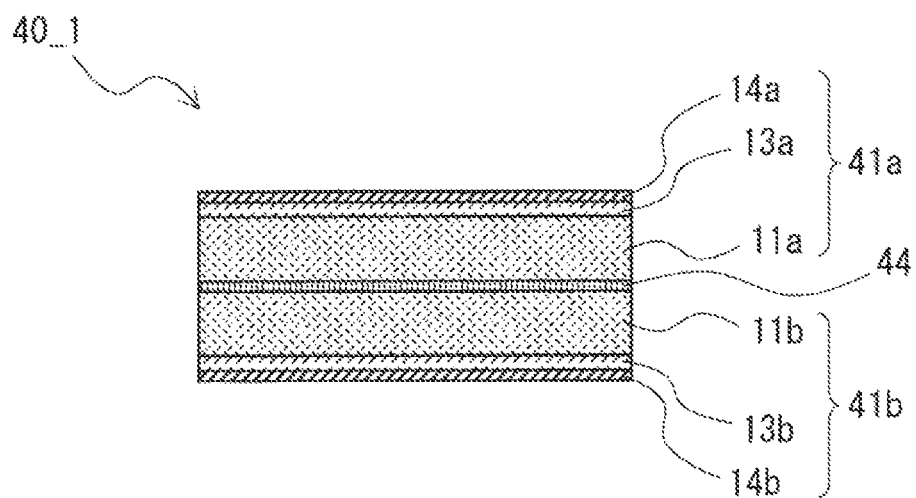
FIG. 16A is a cross-sectional view showing a specific configuration example of the superconducting wire according to the embodiment.

A superconducting wire 40_1 shown in FIG. 16A includes a wire 41a and a wire 41b. The wire 41a includes a base material 11a, a superconductor layer 13a formed on the surface of the base material 11a, and a protection layer 14a formed on the surface of the superconductor layer 13a. An intermediate layer (see the intermediate layer 12 shown in FIG. 9) may be formed between the base material 11a and the superconductor layer 13a as appropriate. Further, the wire 41b includes a base material 11b, a superconductor layer 13b formed on the surface of the base material 11b, and a protection layer 14b formed on the surface of the superconductor layer 13b. An intermediate layer (see the intermediate layer 12 shown in FIG. 9) may be formed between the base material 11b and the superconductor layer 13b as appropriate.

In the superconducting wire 40_1 shown in FIG. 16A, the wire 41a and the wire 41b are arranged in such a way that the superconductor layer 13a of the wire 41a and the superconductor layer 13b of the wire 41b face outward to each other. Specifically, the wire 41a and the wire 41b are formed, and the base material 11a and the base material 11b are bonded to each other using conductive adhesive 44 in such a way that these two wires are opposed to each other.

The aforementioned materials may be used for the material that forms the superconducting wire 40_1. That is, Hastelloy can be used, for example, for the base materials 11a and 11b. Further, a rare earth-based superconductor may be used for the superconductor layers 13a and 13b. Further, for example, a conductive protection layer (silver layer) or a dielectric protection layer may be used for the protection layer 14b.

In the superconducting wire 40_1 shown in FIG. 16A, the wires 41a and 41b are formed and these two wires are bonded to each other in such a way that these two wires are opposed to each other, thereby forming the superconducting wire, whereby it is possible to easily form the superconducting wire. That is, in order to form the superconductor layer on each of the respective surfaces of the base material, a special film-forming device is required, which makes the manufacturing facility complicated. On the other hand, in the superconducting wire 40_1 shown in FIG. 16A, the superconductor layers 13a and 13b are formed on the respective surfaces of the base materials 41a and 41b and the base materials 41a and 41b are bonded to each other in such a way that these two wires are opposed to each other, thereby forming the superconducting wire. As described above, in the superconducting wire 40_1 shown in FIG. 16A, the superconductor layers 13a and 13b are formed on the respective surfaces of the base materials 41a and 41b, whereby it is possible to form the superconductor layers 13a and 13b using a general film-forming device. It is therefore possible to easily form the superconducting wire.

Figure 16B:
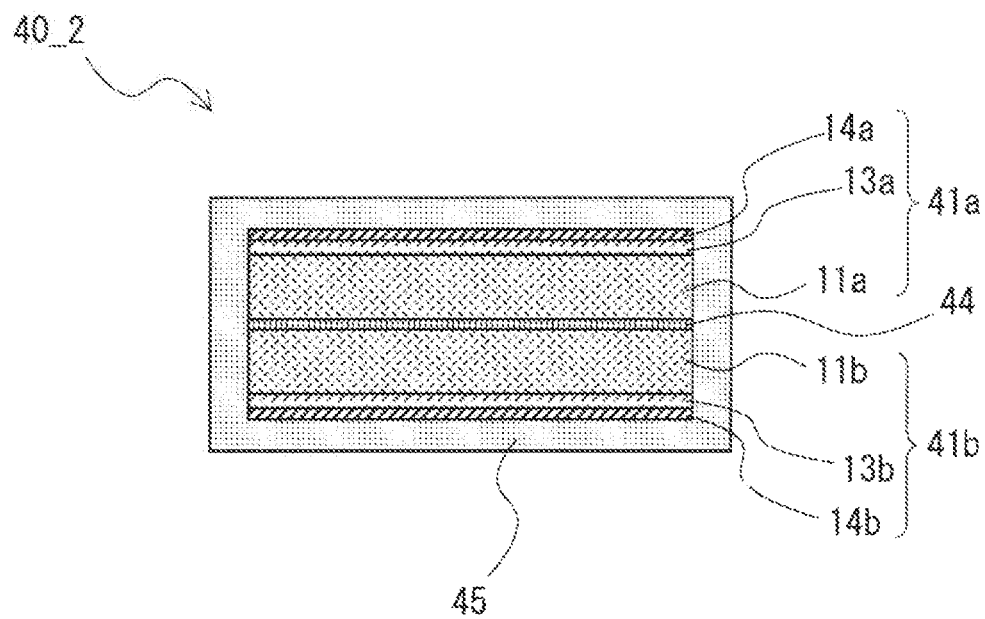
FIG. 16B is a cross-sectional view showing a specific configuration example of the superconducting wire according to the embodiment.

Next, the superconducting wire 40_2 shown in FIG. 16B will be explained. The superconducting wire 40_2 shown in FIG. 16B further includes a dielectric tape 45 around the superconducting wire 40_1 shown in FIG. 16A. That is, in the superconducting wire 40_2 shown in FIG. 16B, the dielectric tape 45 is attached in such a way as to surround the superconducting wire, whereby the wire 41a and the wire 41b are fixed. Accordingly, the wire 41a and the wire 41b are bonded to each other using the conductive adhesive 44 and the wire 41a and the wire 41b are fixed using the dielectric tape 45, whereby it is possible to firmly fix the two wires.

A dielectric tape including polyimide may be, for example, used for the dielectric tape 45. When the dielectric tape 45 is used, a dielectric tape having an appropriate dielectric loss and thickness needs to be used in order to prevent the conductor loss of the superconducting wire 40_2 from being increased. The material that forms the wire 41a and the wire 41b is similar to the material shown in FIG. 16A.

Next, the superconducting wire 40_3 shown in FIG. 16C will be explained. The superconducting wire 40_3 shown in FIG. 16C has a structure in which the conductive adhesive 44 is omitted from the structure of the superconducting wire 40_2 shown in FIG. 16B. The other structures are similar to the structure of the superconducting wire 40_2 shown in FIG. 16B.

Figure 16C:
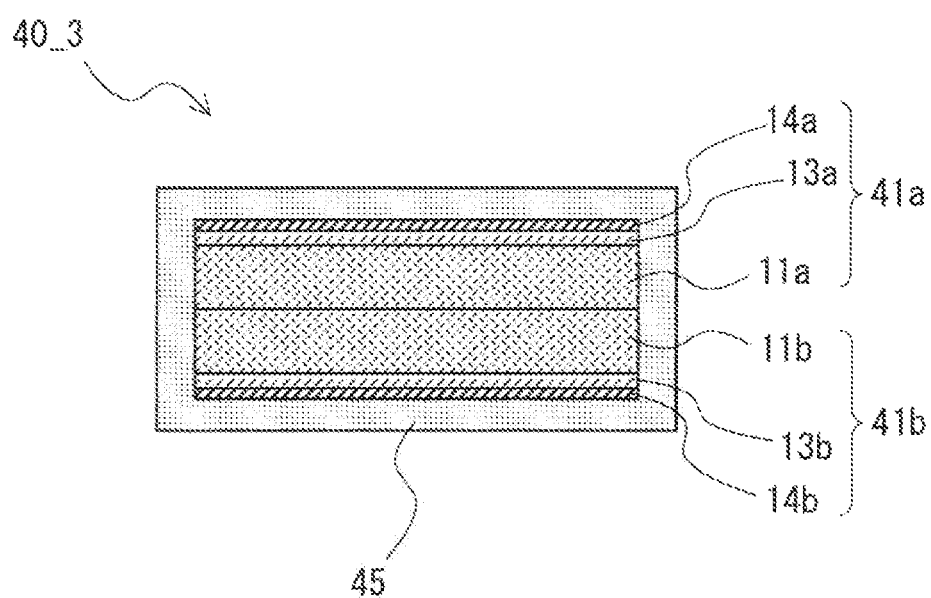
FIG. 16C is a cross-sectional view showing a specific configuration example of the superconducting wire according to the embodiment.

In the superconducting wire 40_3 shown in FIG. 16C, the dielectric tape 45 is attached in such a way as to surround the superconducting wire, whereby the wire 41a and the wire 41b are fixed. It is therefore possible to omit the use of the conductive adhesive, whereby it is possible to simplify the structure of the superconducting wire.

Figure 16D:
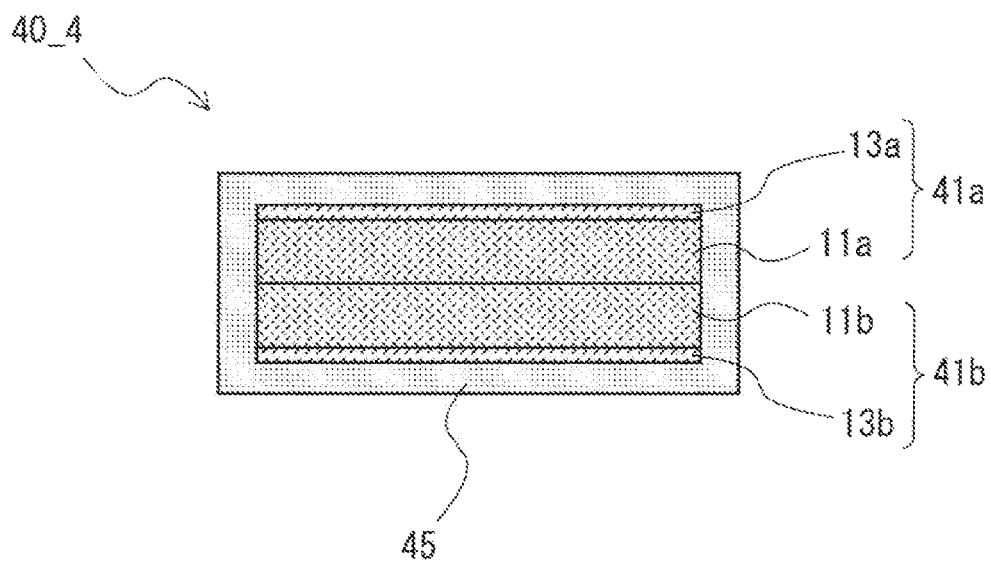
FIG. 16D is a cross-sectional view showing a specific configuration example of the superconducting wire according to the embodiment.

Next, a superconducting wire 40_4 shown in FIG. 16D will be explained. The superconducting wire 40_4 shown in FIG. 16D shows a structure in which the protection layers 14a and 14b are omitted from the structure of the superconducting wire 40_3 shown in FIG. 16C. The other structures are similar to the structure of the superconducting wire 40_3 shown in FIG. 16C.

In the superconducting wire 40_4 shown in FIG. 16D as well, the dielectric tape 45 is attached in such a way as to surround the superconducting wire, whereby the wire 41a and the wire 41b are fixed. If the superconducting wire can be coated with the dielectric tape 45 without any clearance when the dielectric tape 45 is attached to the superconducting wire, the superconductor layers 13a and 13b can be protected from external moisture or humidity. Accordingly, in this case, the protection layers 14a and 14b (see FIG. 16C) can be omitted, whereby it is possible to simplify the structure of the superconducting wire. Due to the reason the same as that stated above, the protection layers 14a and 14b may be omitted in the structure shown in FIG. 16B.

<Specific Configuration Example of Superconducting Wire (Configuration Example 1 Including Core Member)>

When the coil is manufactured using the superconducting wire, the superconducting wire may be embedded in the support member in order to maintain the shape of the coil. When the superconducting wire is embedded in the support member as shown in the results of the simulation shown in FIG. 5, however, the Q value of the coil is reduced due to the dielectric loss of the support member. The present inventors have studied the structure of the superconducting wire capable of maintaining the shape of coil even when the support member is not used.

FIGS. 17A-17D are cross-sectional views showing specific configuration examples of the superconducting wire according to the embodiment (cross-sectional views taken along the plane perpendicular to the longitudinal direction of the superconducting wire). First, the configuration example shown in FIG. 17A will be explained.

Figure 17A:
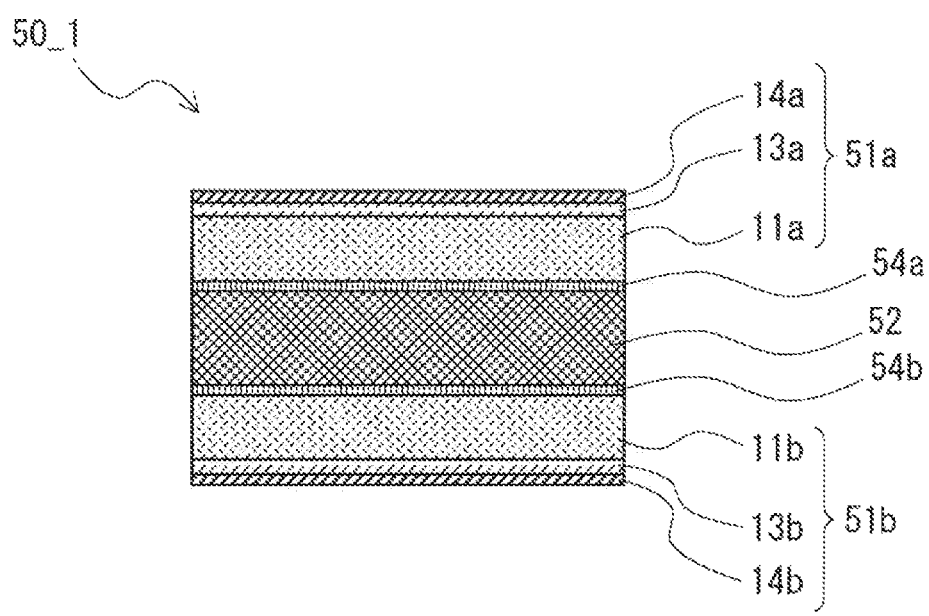
FIG. 17A is a cross-sectional view showing a specific configuration example of the superconducting wire according to the embodiment.

A superconducting wire 50_1 shown in FIG. 17A includes a wire 51a and a wire 51b. The wire 51a includes a base material 11a, a superconductor layer 13a formed on the surface of the base material 11a, and a protection layer 14a formed on the surface of the superconductor layer 13a. An intermediate layer (see the intermediate layer 12 shown in FIG. 9) may be formed between the base material 11a and the superconductor layer 13a as appropriate. Further, the wire 51b includes a base material 11b, a superconductor layer 13b formed on the surface of the base material 11b, and a protection layer 14b formed on the surface of the superconductor layer 13b. An intermediate layer (see the intermediate layer 12 shown in FIG. 9) may be formed between the base material 11b and the superconductor layer 13b as appropriate.

In the superconducting wire 50_1 shown in FIG. 17A, the wire 51a and the wire 51b are arranged in such a way that the superconductor layer 13a of the wire 51a and the superconductor layer 13b of the wire 51b face outward to each other. Further, a core member 52 is arranged between the wire 51a and the wire 51b. Specifically, the base material 11a of the wire 51a is bonded to the core member 52 using conductive adhesive 54a on one surface of the core member 52. Further, the base material 11b of the wire 51b is bonded to the core member 52 using conductive adhesive 54b on the other surface of the core member 52.

The core member 52 is an electrically conductive material capable of maintaining the shape of the superconducting wire 50_1 when the superconducting wire 50_1 is bent. Further, a material having an electrical conductivity higher than that of the base materials 11a and 11b is used for the core member 52. For example, Hastelloy may be used for the base materials 11a and 11b and copper may be used for the core member 52.

In the structure shown in FIG. 16A, for example, in order to allow the shape of the superconducting wire to be maintained when the superconducting wire is bent, the thickness of the base materials 11a and 11b needs to be increased. However, when, for example, the base materials 11a and 11b are formed using Hastelloy, the Q value of the superconducting wire is degraded since the conductor loss of Hastelloy is large (see FIG. 14A).

In view of this point, in the superconducting wire 50_1 shown in FIG. 17A, the core member 52 is provided, and a material (e.g., copper) having an electrical conductivity larger than that of the base materials 11a and 11b is used for the core member 52. Therefore, it is possible to independently maintain the shape of the superconducting wire 50_1 when the superconducting wire 50_1 is bent and to prevent the Q value of the superconducting wire from being degraded.

Figure 17B:
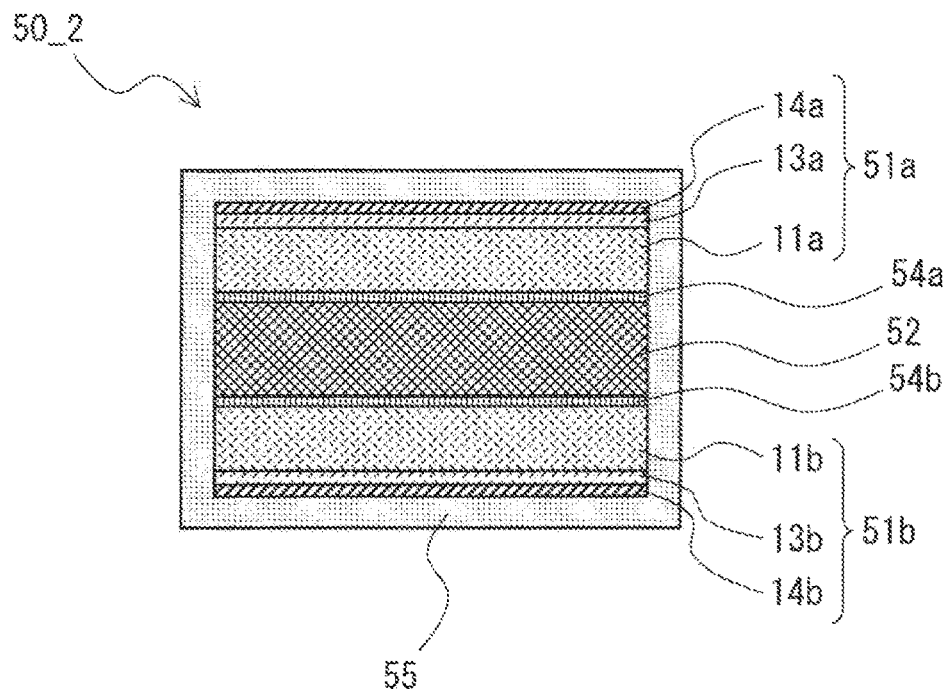
FIG. 17B is a cross-sectional view showing a specific configuration example of the superconducting wire according to the embodiment.

Next, a superconducting wire 50_2 shown in FIG. 17B will be explained. The superconducting wire 50_2 shown in FIG. 17B further includes a dielectric tape 55 around the superconducting wire 50_1 shown in FIG. 17A. That is, in the superconducting wire 50_2 shown in FIG. 17B, the dielectric tape 55 is attached in such a way as to surround the superconducting wire, whereby the wire 51a, the core member 52, and the wire 51b are fixed. Therefore, the wire 51a, the core member 52, and the wire 51b are bonded to one another using the conductive adhesive 54a and 54b and the wire 51a, the core member 52, and the wire 51b are fixed using the dielectric tape 55, whereby it is possible to firmly fix the core member 52 and the two wire 51a, 51b.

A dielectric tape including polyimide can be, for example, used for the dielectric tape 55. When the dielectric tape 55 is used, a dielectric tape having an appropriate dielectric loss and thickness needs to be used in order to prevent the conductor loss of the superconducting wire 50_2 from being increased. The material that forms the wires 51a and 51b and the core member 52 is similar to the material shown in FIG. 17A.

Figure 17C:
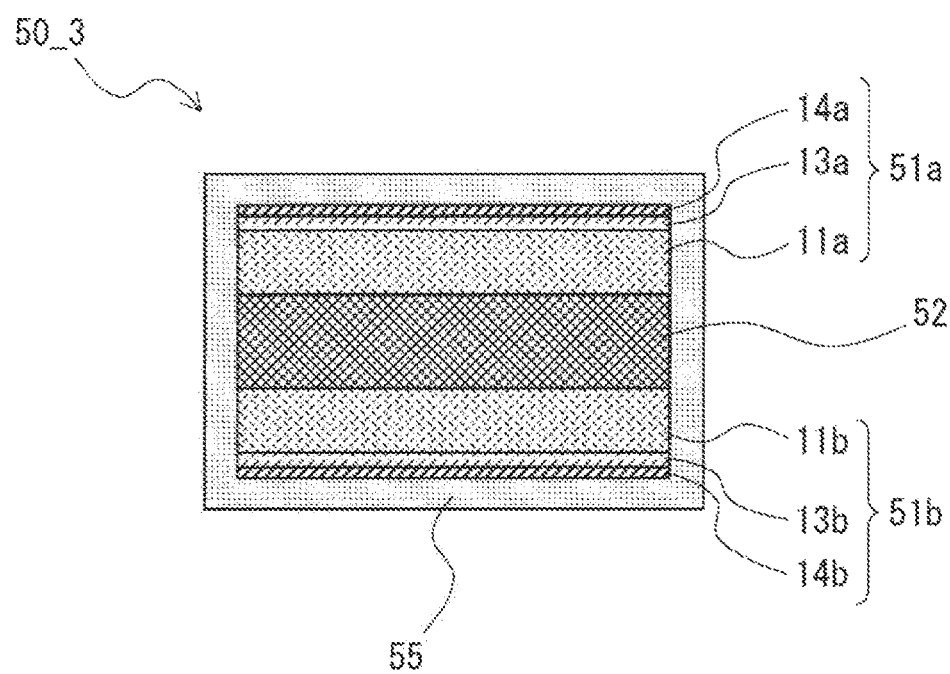
FIG. 17C is a cross-sectional view showing a specific configuration example of the superconducting wire according to the embodiment.

Next, a superconducting wire 50_3 shown in FIG. 17C will be explained. The superconducting wire 50_3 shown in FIG. 17C shows a structure in which the conductive adhesive 54a and 54b are omitted in the structure of the superconducting wire 50_2 shown in FIG. 17B. The other structures are similar to the structure of the superconducting wire 50_2 shown in FIG. 17B.

In the superconducting wire 50_3 shown in FIG. 17C, the dielectric tape 55 is attached in such a way as to surround the superconducting wire, whereby the wire 51a, the core member 52, and the wire 51b are fixed. It is therefore possible to omit the use of the conductive adhesive, whereby it is possible to simplify the structure of the superconducting wire.

Figure 17D:
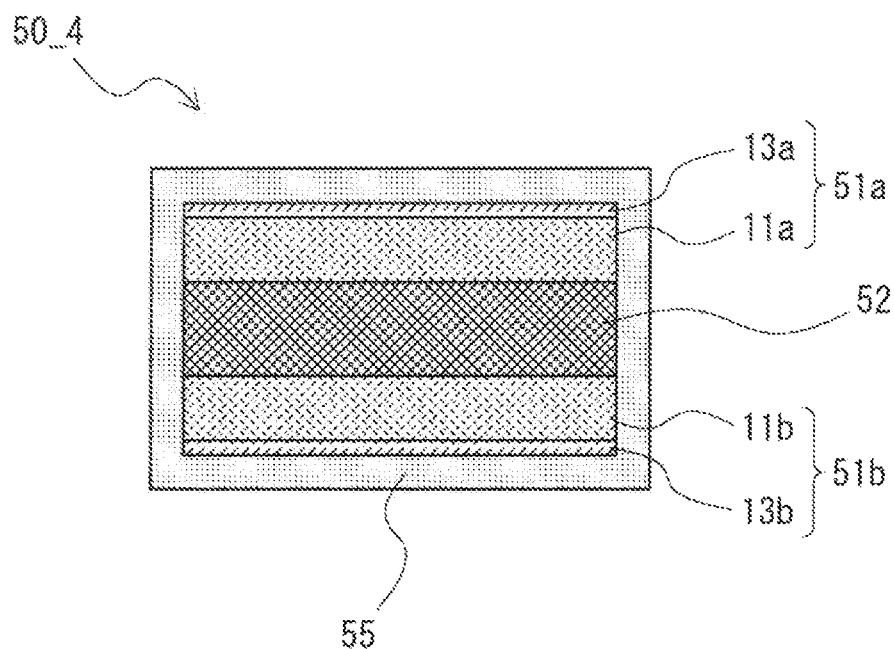
FIG. 17D is a cross-sectional view showing a specific configuration example of the superconducting wire according to the embodiment.

Next, a superconducting wire 50_4 shown in FIG. 17D will be explained. The superconducting wire 50_4 shown in FIG. 17D shows a structure in which the protection layers 14a and 14b are omitted from the structure of the superconducting wire 50_3 shown in FIG. 17C. The other structures are similar to the structure of the superconducting wire 50_3 shown in FIG. 17C.

In the superconducting wire 50_4 shown in FIG. 17D as well, the dielectric tape 55 is attached in such a way as to surround the superconducting wire, whereby the wire 51a, the core member 52, and the wire 51b are fixed. If the superconducting wire can be coated with the dielectric tape 55 without any clearance when the dielectric tape 55 is attached to the superconducting wire, the superconductor layers 13a and 13b can be protected from external moisture or humidity. Accordingly, in this case, the protection layers 14a and 14b (see FIG. 17C) may be omitted, whereby it is possible to simplify the structure of the superconducting wire. Due to the reason the same as that stated above, the protection layers 14a and 14b may be omitted in the structure shown in FIG. 17B.

<Specific Configuration Example of Superconducting Wire (Configuration Example 2 Including Core Member)>

Next, another configuration example of the superconducting wire including the core member will be explained.

FIGS. 18A-18D are cross-sectional views showing specific configuration examples of the superconducting wire according to the embodiment (cross-sectional views taken along the plane perpendicular to the longitudinal direction of the superconducting wire). First, the configuration example shown in FIG. 18A will be explained.

Figure 18A:
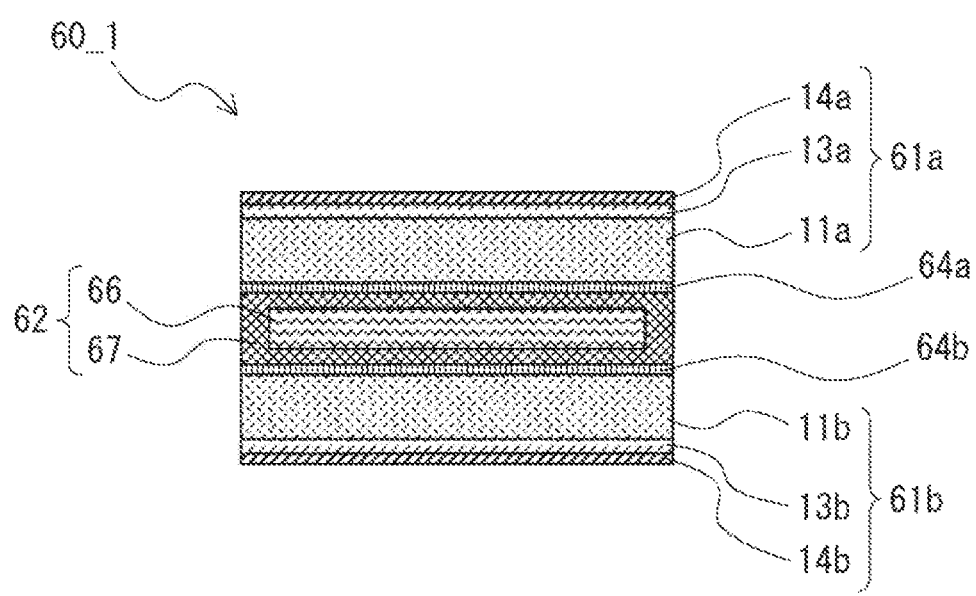
FIG. 18A is a cross-sectional view showing a specific configuration example of the superconducting wire according to the embodiment.

A superconducting wire 60_1 shown in FIG. 18A includes a wire 61a and a wire 61b. The wire 61a includes a base material 11a, a superconductor layer 13a formed on the surface of the base material 11a, and a protection layer 14a formed on the surface of the superconductor layer 13a. An intermediate layer (see the intermediate layer 12 shown in FIG. 9) may be formed between the base material 11a and the superconductor layer 13a as appropriate. Further, the wire 61*b* includes a base material 11*b*, a superconductor layer 13*b* formed on the surface of the base material 11*b*, and a protection layer 14*b* formed on the surface of the superconductor layer 13*b*. An intermediate layer (see the intermediate layer 12 shown in FIG. 9) may be formed between the base material 11*b* and the superconductor layer 13*b* as appropriate.

In the superconducting wire 60_1 shown in FIG. 18A, the wire 61*a* and the wire 61*b* are arranged in such a way that the superconductor layer 13*a* of the wire 61*a* and the superconductor layer 13*b* of the wire 61*b* face outward to each other. Further, a core member 62 is arranged between the wire 61*a* and the wire 61*b*. Specifically, the base material 11*a* of the wire 61*a* is bonded to the core member 62 using conductive adhesive 64*a* on one surface of the core member 62. Further, the base material 11*b* of the wire 61*b* is bonded to the core member 62 using conductive adhesive 64*b* on the other surface of the core member 62.

In the superconducting wire 60_1 shown in FIG. 18A, the core member 62 is formed using a shape maintaining material 66 and an electrically conductive material 67. The shape maintaining material 66 is a material capable of maintaining the shape of the superconducting wire 60_1 when the superconducting wire 60_1 is bent. The shape maintaining material 66 may be formed using an electrically conductive material or an insulator. The electrically conductive material 67 is arranged around the shape maintaining material 66 and is formed using a material having a high electrical conductivity (e.g., copper). For example, the thickness of the electrically conductive material 67 arranged around the shape maintaining material 66 is preferably made larger than the skin depth.

In the superconducting wire 60_1 shown in FIG. 18A, the core member 62 is formed using the shape maintaining material 66 and the electrically conductive material 67. Therefore, compared to the superconducting wire 50_1 shown in FIG. 17A, the thickness of the core member can be made thin. That is, when the core member 52 is formed using one material (e.g., copper) like the superconducting wire 50_1 shown in FIG. 17A, the core member 52 needs to have a certain degree of thickness so as to be able to maintain the shape of the superconducting wire. On the other hand, the superconducting wire 60_1 shown in FIG. 18A is able to form the core member 62 using the shape maintaining material 66 specialized for maintaining the shape of the superconducting wire and the electrically conductive material 67 specialized for conductivity, whereby it is possible to make the thickness of the core member 62 smaller than the thickness of the core member 52 used in FIG. 17A. Further, in the superconducting wire 60_1 shown in FIG. 18A as well, it is possible to independently maintain the shape of the superconducting wire when the superconducting wire is bent and to prevent the Q value of the superconducting wire from being degraded.

Figure 19:
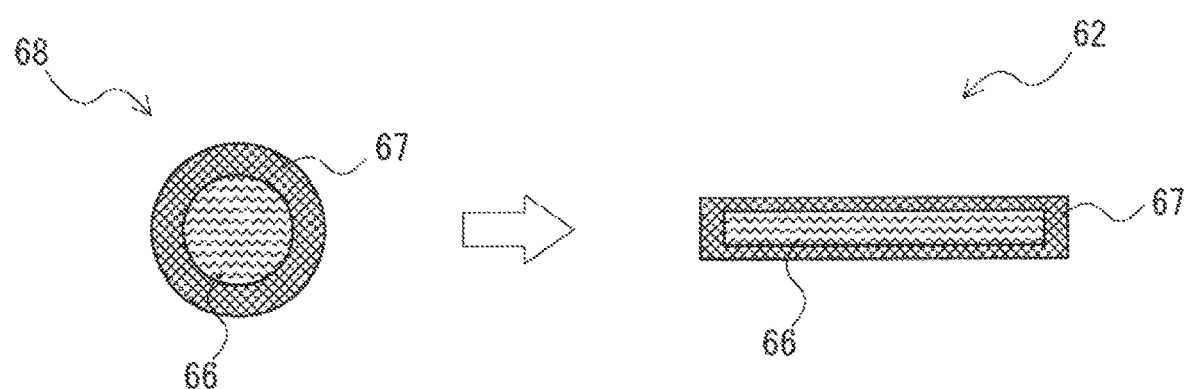
FIG. 19 is a cross-sectional view showing one example of a method of manufacturing a core member included in the superconducting wire according to the embodiment.

FIG. 19 is a cross-sectional view for describing one example of a method of manufacturing the core member 62. When the core member 62 is manufactured, the shape maintaining material 66 having, for example, a circular cross section, is coated with the electrically conductive material 67, thereby manufacturing a wire 68. After that, the outer circumferential surface of the wire 68 is compressed using a rolling mill roll, whereby the core member 62 having a rectangular cross section can be formed.

Figure 18B:
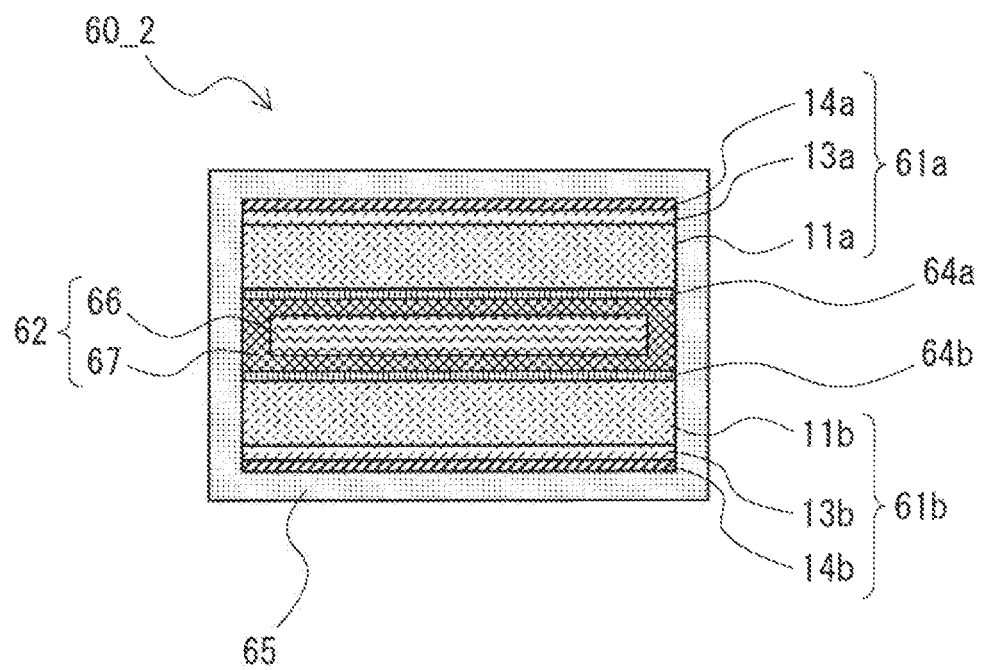
FIG. 18B is a cross-sectional view showing a specific configuration example of the superconducting wire according to the embodiment.

Next, a superconducting wire 60_2 shown in FIG. 18B will be explained. The superconducting wire 60_2 shown in FIG. 18B further includes a dielectric tape 65 around the superconducting wire 60_1 shown in FIG. 18A. That is, in the superconducting wire 60_2 shown in FIG. 18B, the dielectric tape 65 is attached in such a way as to surround the superconducting wire, whereby the wire 61*a*, the core member 62, and the wire 61*b* are fixed. Therefore, the wire 61*a*, the core member 62, and the wire 61*b* are bonded to one another using the conductive adhesive 64*a* and 64*b*, and the wire 61*a*, the core member 62, and the wire 61*b* are fixed using the dielectric tape 65, whereby the core member 62 and the two wires 61*a* and 61*b* can be firmly fixed.

A dielectric tape including, for example, polyimide, can be used for the dielectric tape 65. When the dielectric tape 65 is used, a dielectric tape having an appropriate dielectric loss and thickness needs to be used so as to prevent the conductor loss of the superconducting wire 60_2 from being increased. The material for forming the wires 61*a* and 61*b*, and the core member 62 is similar to the material shown in FIG. 18A.

Figure 18C:
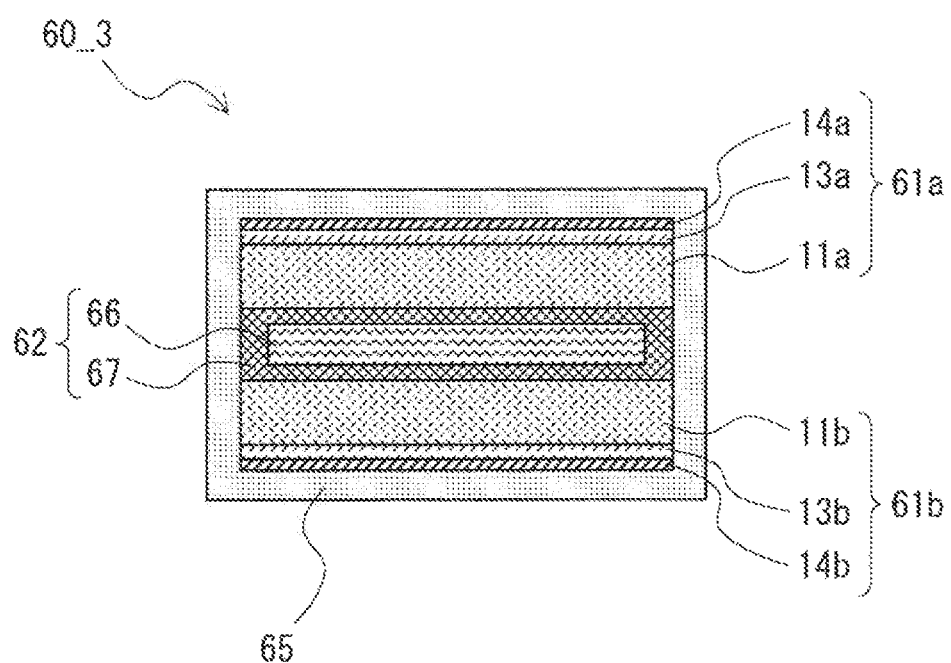
FIG. 18C is a cross-sectional view showing a specific configuration example of the superconducting wire according to the embodiment.

Next, a superconducting wire 60_3 shown in FIG. 18C will be explained. The superconducting wire 60_3 shown in FIG. 18C shows a structure in which the conductive adhesive 64*a* and 64*b* are omitted from the structure of the superconducting wire 60_2 shown in FIG. 18B. The other structures are similar to the structure of the superconducting wire 60_2 shown in FIG. 18B.

In the superconducting wire 60_3 shown in FIG. 18C, the dielectric tape 65 is attached in such a way as to surround the superconducting wire, whereby the wire 61*a*, the core member 62, and the wire 61*b* are fixed. It is therefore possible to omit the use of the conductive adhesive, whereby it is possible to simplify the structure of the superconducting wire.

Figure 18D:
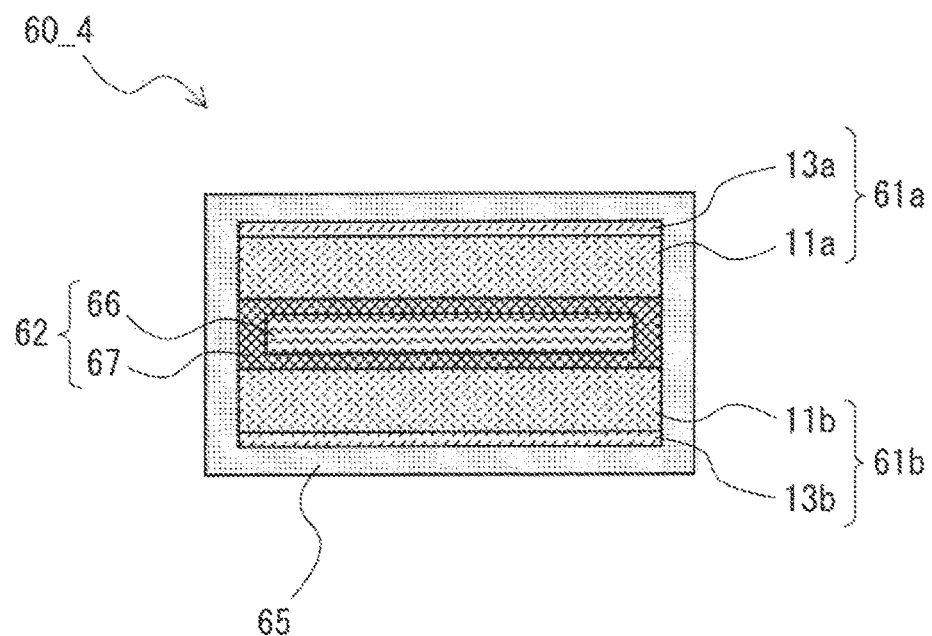
FIG. 18D is a cross-sectional view showing a specific configuration example of the superconducting wire according to the embodiment.

Next, a superconducting wire 60_4 shown in FIG. 18D will be explained. The superconducting wire 60_4 shown in FIG. 18D shows a structure in which the protection layers 14*a* and 14*b* are omitted from the structure of the superconducting wire 60_3 shown in FIG. 18C. The other structures are similar to the structure of the superconducting wire 60_3 shown in FIG. 18C.

In the superconducting wire 60_4 shown in FIG. 18D as well, a dielectric tape 65 is attached in such a way as to surround the superconducting wire, whereby the wire 61*a*, the core member 62, and the wire 61*b* are fixed. If the superconducting wire can be coated with the dielectric tape 65 without any clearance when the dielectric tape 65 is attached to the superconducting wire, the superconductor layers 13*a* and 13*b* can be protected from external moisture or humidity. Accordingly, in this case, the protection layers 14*a* and 14*b* (see FIG. 18C) may be omitted, whereby it is possible to simplify the structure of the superconducting wire. Due to the reason the same as that stated above, the protection layers 14*a* and 14*b* may be omitted in the structure shown in FIG. 18B.

Figure 20:
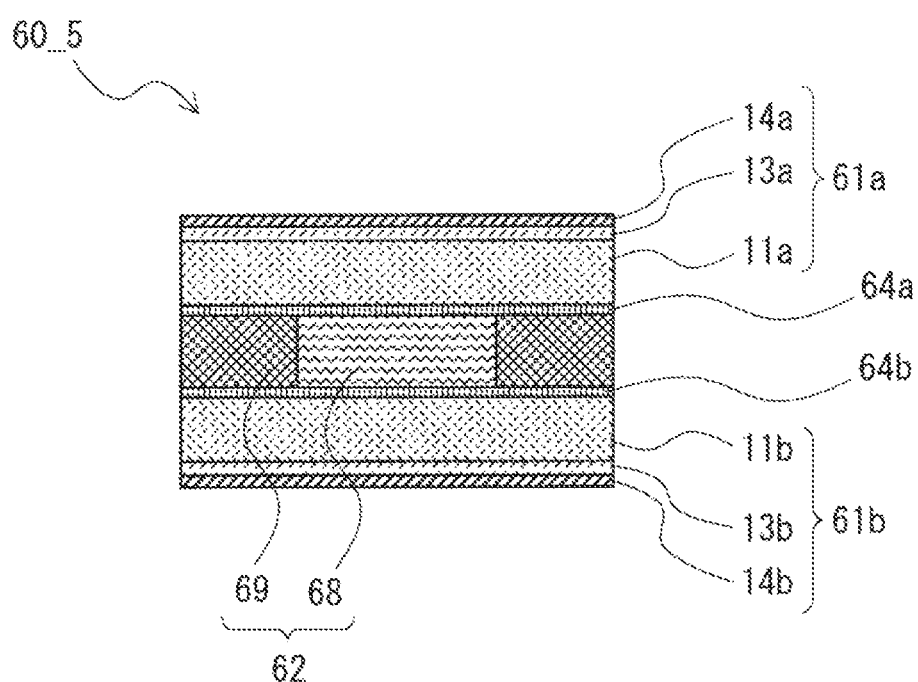
FIG. 20 is a cross-sectional view showing a specific configuration example of the superconducting wire according to the embodiment.

Further, in the present disclosure, as shown in the cross-sectional view in FIG. 20, when the core member 62 is formed, an electrically conductive material 69 may be arranged on each of the respective sides of the shape maintaining material 68. In this case as well, the thickness of the core member 62 can be made smaller than the thickness of the core member 52 in FIG. 17A. Further, it is possible to independently maintain the shape of the superconducting wire when the superconducting wire is bent and to prevent the Q value of the superconducting wire from being degraded. Further, the structures shown in FIGS. 18B-18D may be applied to the structure shown in FIG. 20. That is, a dielectric tape may be further provided in the structure shown in FIG. 20 (see FIG. 18B). Alternatively, the conductive adhesive may be omitted (see FIG. 18C). Alternatively, the protection layer may be omitted (see FIG. 18D).

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

While a part or all of the aforementioned exemplary embodiments may be described as shown in the following Supplementary notes, it is not limited to them.

(Supplementary Note 1)
A superconducting wire comprising:
a base material;
a superconductor layer formed on each of the respective surfaces of the base material; and
a conductive protection layer formed on each of the surfaces of the respective superconductor layers,
wherein the thickness of each of the conductive protection layers is 5% or less of the skin depth when a high-frequency current flows through the superconducting wire.

(Supplementary Note 2)
The superconducting wire according to Supplementary note 1, wherein the thickness of each of the conductive protection layers is 3% or less of the skin depth when a high-frequency current flows through the superconducting wire.

(Supplementary Note 3)
The superconducting wire according to Supplementary note 1, wherein the conductive protection layer is formed using silver.

(Supplementary Note 4)
A superconducting wire comprising:
a base material;
a superconductor layer formed on each of the respective surfaces of the base material; and
a dielectric protection layer formed on each of the surfaces of the respective superconductor layers,
wherein the dielectric protection layer is formed using a material having a value of a dielectric tangent (tan δ) of 0.001 or smaller.

(Supplementary Note 5)
The superconducting wire according to Supplementary note 4, wherein the dielectric protection layer is formed using a material having a value of a dielectric tangent (tan δ) of 0.0001 or smaller and a thickness of 0.5 mm or smaller.

(Supplementary Note 6)
The superconducting wire according to Supplementary note 4, wherein the dielectric protection layer is formed using a material having a value of a dielectric tangent (tan δ) of 0.001 or smaller and a thickness of 0.05 mm or smaller.

(Supplementary Note 7)
The superconducting wire according to Supplementary note 4, wherein the dielectric protection layer is formed using polystyrene having a thickness of 0.5 mm or smaller.

(Supplementary Note 8)
The superconducting wire according to Supplementary note 4, wherein the dielectric protection layer is formed using polyimide having a thickness of 0.4 mm or smaller.

(Supplementary Note 9)
The superconducting wire according to Supplementary note 4, wherein the dielectric protection layer is formed using sapphire, magnesium oxide, or cerium oxide.

(Supplementary Note 10)
The superconducting wire according to Supplementary note 1, wherein the base material is made of Hastelloy.

(Supplementary Note 11)
The superconducting wire according to Supplementary note 10, wherein the Hastelloy has a width equal to or larger than 4 mm.

(Supplementary Note 12)
The superconducting wire according to Supplementary note 10, wherein the Hastelloy has a thickness of 100 μm-600 μm.

(Supplementary Note 13)
The superconducting wire according to Supplementary note 10, wherein the Hastelloy has a thickness of 100 μm-200 μm.

(Supplementary Note 14)
The superconducting wire according to Supplementary note 1, wherein the superconductor layer is formed using a rare earth-based superconducting material.

(Supplementary Note 15)
A coil unit comprising:
a coil obtained by winding the superconducting wire according to Supplementary note 1 in a spiral shape; and
a support member configured to support the coil,
wherein the support member is formed using a dielectric body and includes a plurality of supporting parts that are extended outwardly from the center of the coil.

(Supplementary Note 16)
The coil unit according to Supplementary note 15, wherein the support member comprises four supporting parts intersecting with one another at the center of the coil.

(Supplementary Note 17)
The coil unit according to Supplementary note 15, wherein the support member is formed using expanded polystyrene.

(Supplementary Note 18)
The coil unit according to Supplementary note 15, wherein the support member is formed using sapphire.

(Supplementary Note 19)
A coil unit comprising:
a coil formed by winding the superconducting wire according to Supplementary note 1; and
a support member configured to support the coil,
wherein the support member is formed using sapphire.

(Supplementary Note 20)
A superconducting wire comprising:
a first wire comprising a first base material and a first superconductor layer formed on a surface of the first base material; and
a second wire comprising a second base material and a second superconductor layer formed on a surface of the second base material,
wherein the first and second wires are arranged in such a way that the first and second superconductor layers face outward to each other.

(Supplementary Note 21)
The superconducting wire according to Supplementary note 20, wherein the first base material and the second base material are bonded to each other using conductive adhesive.

(Supplementary Note 22)
The superconducting wire according to Supplementary note 20, wherein the first and second wires are fixed by attaching a dielectric tape in such a way as to surround the superconducting wire.

(Supplementary Note 23)
The superconducting wire according to Supplementary note 20, wherein a core member capable of maintaining a shape of the superconducting wire when the superconducting wire is bent is further arranged between the first wire and the second wire, and the core member has an electrical conductivity higher than that of the first and second base materials.

(Supplementary Note 24)

The superconducting wire according to Supplementary note 23, wherein the first base material is bonded to the core member on one surface of the core member using conductive adhesive, and the second base material is bonded to the core member on another surface, which is the surface opposite to the one surface of the core member, using conductive adhesive.

(Supplementary Note 25)

The superconducting wire according to Supplementary note 23, wherein the first and second wires and the core member are fixed to each other by attaching a dielectric tape in such a way as to surround the superconducting wire.

(Supplementary Note 26)

The superconducting wire according to Supplementary note 23, wherein the first and second base materials are formed using Hastelloy, and the core member is formed using copper.

(Supplementary Note 27)

The superconducting wire according to Supplementary note 23, wherein the core member is formed using a shape maintaining material capable of maintaining the shape of the superconducting wire when the superconducting wire is bent and an electrically conductive material arranged around the shape maintaining material.

(Supplementary Note 28)

The superconducting wire according to Supplementary note 20, wherein a protection film is formed on each of the surfaces of the first and second superconductor layers.

What is claimed is:

1. A superconducting wire comprising:
   a first wire comprising a first base material and a first superconductor layer formed on a surface of the first base material;
   a second wire comprising a second base material and a second superconductor layer formed on a surface of the second base material, and
   a core member arranged between the first wire and the second wire;
   wherein the first and second wires are arranged in such a way that the first and second superconductor layers face outward from each other, and
   the core member is formed using a shape maintaining material configured to maintain the shape of the superconducting wire when the superconducting wire is bent and an electrically conductive material arranged around the shape maintaining material, and
   the first base material and the second base material are bonded to the core member using conductive adhesive.

2. The superconducting wire according to claim 1, wherein the first and second wires are fixed by attaching a dielectric tape in such a way as to surround the superconducting wire.

3. The superconducting wire according to claim 1, wherein
   the core member has an electrical conductivity higher than that of the first and second base materials.

4. The superconducting wire according to claim 1, further comprising:
   a first conductive protection layer formed on a surface of the first superconductor layer, and
   a second conductive protection layer formed on a surface of the second superconductor layer,
   wherein the thickness of each of the first and second conductive protection layers is 5% or less of the skin depth when a high-frequency current flows through the superconducting wire.

5. The superconducting wire according to claim 1, further comprising:
   a first dielectric protection layer formed on a surface of the first superconductor layer, and
   a second dielectric protection layer formed on a surface of the second superconductor layer,
   wherein the first and second dielectric protection layers are formed using a material having a value of a dielectric tangent (tan $\delta$) of 0.001 or smaller.

6. A superconducting wire comprising:
   a first wire comprising a first base material and a first superconductor layer formed on a surface of the first base material;
   a second wire comprising a second base material and a second superconductor layer formed on a surface of the second base material, and
   a core member arranged between the first wire and the second wire;
   wherein the first and second wires are arranged in such a way that the first and second superconductor layers face outward from each other,
   the core member is formed using a shape maintaining material configured to maintain the shape of the superconducting wire when the superconducting wire is bent and an electrically conductive material arranged around the shape maintaining material,
   the core member has an electrical conductivity higher than that of the first and second base materials,
   the first base material is bonded to the core member on one surface of the core member using conductive adhesive, and
   the second base material is bonded to the core member on another surface, which is the surface opposite to the one surface of the core member, using conductive adhesive.

* * * * *